United States Patent
Nuriya et al.

(10) Patent No.: US 9,661,772 B2
(45) Date of Patent: May 23, 2017

(54) WATERPROOF CONTROL UNIT AND METHOD OF ASSEMBLING THE SAME

(71) Applicant: MITSUBISHI ELECTRIC CORPORATION, Tokyo (JP)

(72) Inventors: Nobuaki Nuriya, Tokyo (JP); Mitsunori Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 142 days.

(21) Appl. No.: 14/690,712

(22) Filed: Apr. 20, 2015

(65) Prior Publication Data

US 2016/0113137 A1    Apr. 21, 2016

(30) Foreign Application Priority Data

Oct. 17, 2014    (JP) .................................. 2014-212612

(51) Int. Cl.
   *H05K 5/06*    (2006.01)
   *H05K 5/00*    (2006.01)
   (Continued)

(52) U.S. Cl.
   CPC .......... *H05K 5/062* (2013.01); *H01R 13/5202* (2013.01); *H05K 3/28* (2013.01);
   (Continued)

(58) Field of Classification Search
   None
   See application file for complete search history.

(56) References Cited

U.S. PATENT DOCUMENTS 7,965,510 B2 *   6/2011   Suzuki ................... B60K 6/365
                                                              165/80.4
8,339,801 B2 *  12/2012   Tominaga ............ B62D 5/0406
                                                              361/752
(Continued)

FOREIGN PATENT DOCUMENTS

JP     4470980 B2    6/2010
JP     5281121 B2    9/2013
JP     5526096 B2    6/2014

OTHER PUBLICATIONS

U.S. Appl No. 14/454,264, Mitsubishi Electric Corp., filed Aug. 7, 2014.
(Continued)

*Primary Examiner* — Chau N. Nguyen
*Assistant Examiner* — Muhammed Azam
(74) *Attorney, Agent, or Firm* — Sughrue Mion, PLLC; Richard C Turner

(57) ABSTRACT

In a waterproof control unit in which a part of a connector housing mounted on a circuit board is exposed and the circuit board is hermetically housed in a casing including a base and a cover, a sealing gap between the cover and the connector housing is defined between fitting surfaces of a first concave thread and a first convex thread, and a waterproof sealing material is applied to the sealing gap. A waterproof sealing material is applied to the latter sealing gap. Each of the sealing gaps extends inward and outward across an inner boundary surface of a partition wall of the connector housing. Plane movement of each of the sealing gaps is restricted by side-surface convex threads and side-surface concave threads.

12 Claims, 21 Drawing Sheets

(51) Int. Cl.
*H05K 7/20* (2006.01)
*H01R 13/52* (2006.01)
*H05K 3/28* (2006.01)
*H05K 3/34* (2006.01)

(52) U.S. Cl.
CPC ........... *H05K 3/341* (2013.01); *H05K 5/0056* (2013.01); *H05K 7/20445* (2013.01)

(56) References Cited

U.S. PATENT DOCUMENTS

| | | | | |
|---|---|---|---|---|
| 9,526,194 B2* | 12/2016 | Fujita | ................. | H05K 7/20927 |
| 2001/0021103 A1* | 9/2001 | Takagi | ................. | B62D 5/0406 |
| | | | | 361/752 |
| 2002/0024800 A1* | 2/2002 | Skofljanec | ............. | H05K 5/006 |
| | | | | 361/752 |
| 2003/0184969 A1* | 10/2003 | Itabashi | ............... | H05K 1/0206 |
| | | | | 361/688 |
| 2005/0020141 A1* | 1/2005 | Mizutani | ........... | H01R 13/5202 |
| | | | | 439/677 |
| 2005/0233618 A1* | 10/2005 | Yamashita | ............. | H05K 7/026 |
| | | | | 439/76.2 |
| 2006/0077643 A1* | 4/2006 | Mayuzumi | ............ | H05K 3/284 |
| | | | | 361/753 |
| 2006/0082975 A1* | 4/2006 | Caines | ................... | H05K 5/061 |
| | | | | 361/719 |
| 2008/0049476 A1* | 2/2008 | Azuma | ..................... | B60L 3/12 |
| | | | | 363/131 |
| 2008/0278918 A1* | 11/2008 | Tominaga | ............ | B62D 5/0406 |
| | | | | 361/719 |
| 2009/0122489 A1* | 5/2009 | Tominaga | ............ | B62D 5/0406 |
| | | | | 361/704 |
| 2009/0129035 A1* | 5/2009 | Kojima | ................ | H05K 5/0052 |
| | | | | 361/752 |
| 2011/0235289 A1* | 9/2011 | Watanabe | ........... | H05K 5/0052 |
| | | | | 361/752 |
| 2013/0077255 A1* | 3/2013 | Abe | ....................... | H01L 23/36 |
| | | | | 361/716 |
| 2013/0235539 A1* | 9/2013 | Hashimoto | .............. | H05K 5/06 |
| | | | | 361/752 |
| 2013/0294040 A1* | 11/2013 | Fukumasu | .............. | H02M 1/44 |
| | | | | 361/752 |
| 2014/0313806 A1* | 10/2014 | Shinohara | .......... | H05K 7/20927 |
| | | | | 363/141 |
| 2015/0009629 A1* | 1/2015 | Moon | ................... | H05K 5/0034 |
| | | | | 361/709 |
| 2015/0077956 A1* | 3/2015 | Sano | .................... | H05K 5/0069 |
| | | | | 361/752 |
| 2015/0216070 A1* | 7/2015 | Nuriya | ................ | B32B 37/0076 |
| | | | | 361/752 |
| 2015/0245535 A1* | 8/2015 | Fujita | .................... | H02M 7/003 |
| | | | | 361/689 |
| 2015/0282362 A1* | 10/2015 | Nuriya | ................... | H05K 5/061 |
| | | | | 361/728 |
| 2015/0305188 A1* | 10/2015 | Maeda | ................. | H05K 7/1432 |
| | | | | 361/728 |
| 2016/0113137 A1* | 4/2016 | Nuriya | ............... | H01R 13/5202 |
| | | | | 361/728 |

OTHER PUBLICATIONS

U.S. Appl No. 14/334,154, Mitsubishi Electric Corp., filed Jul. 17, 2014.

* cited by examiner

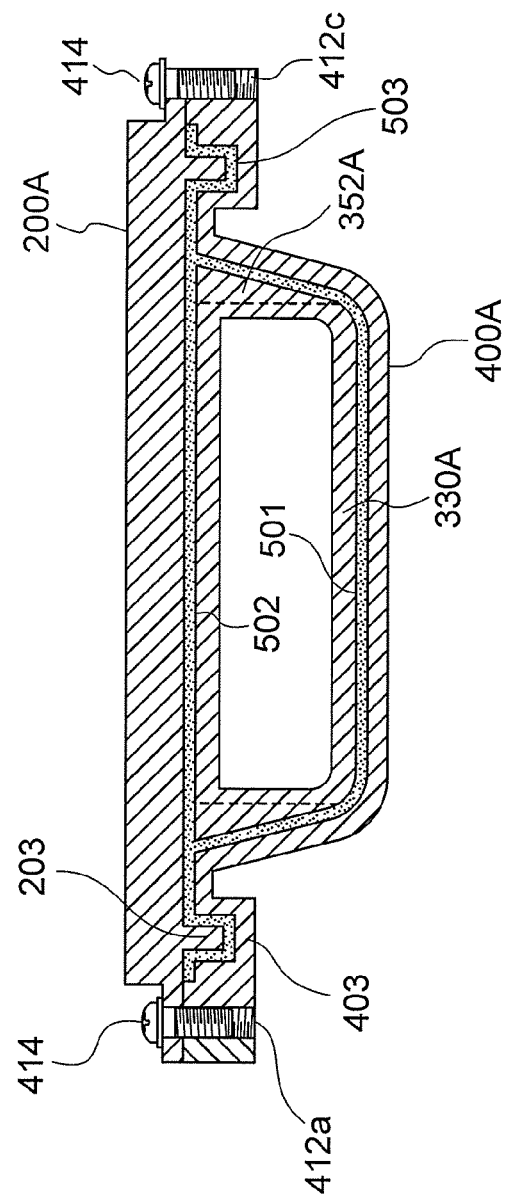

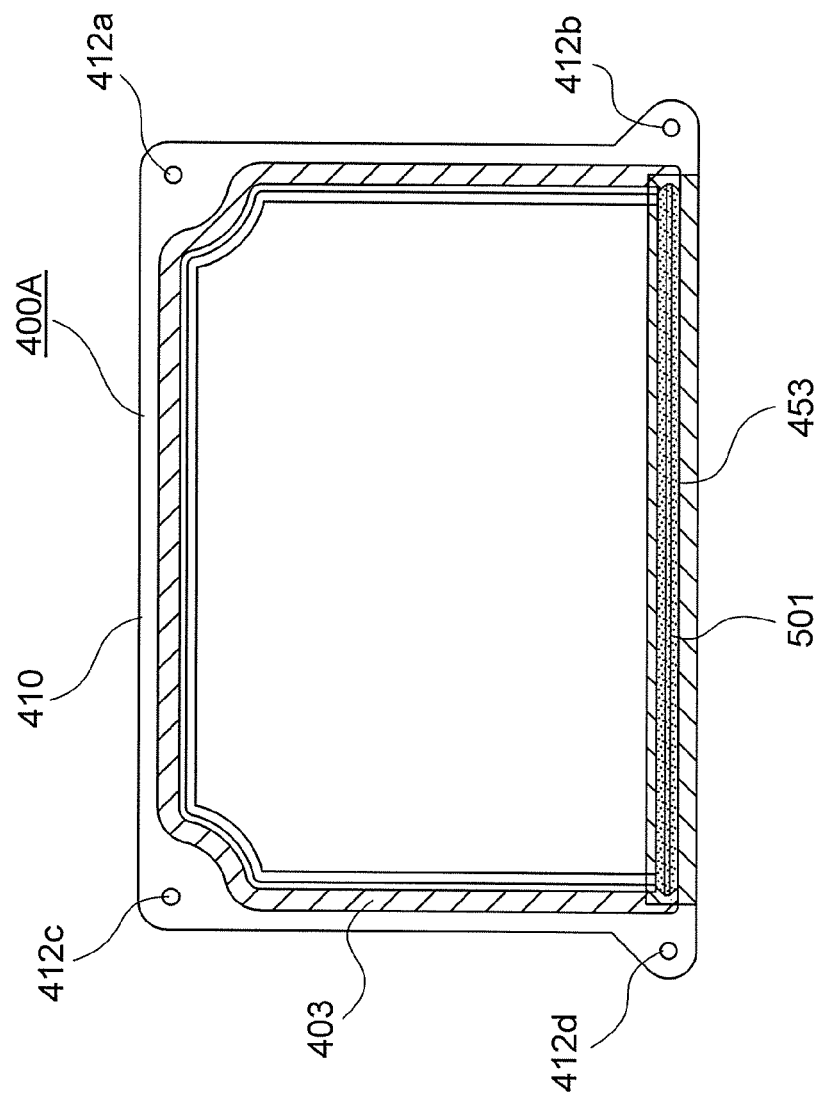

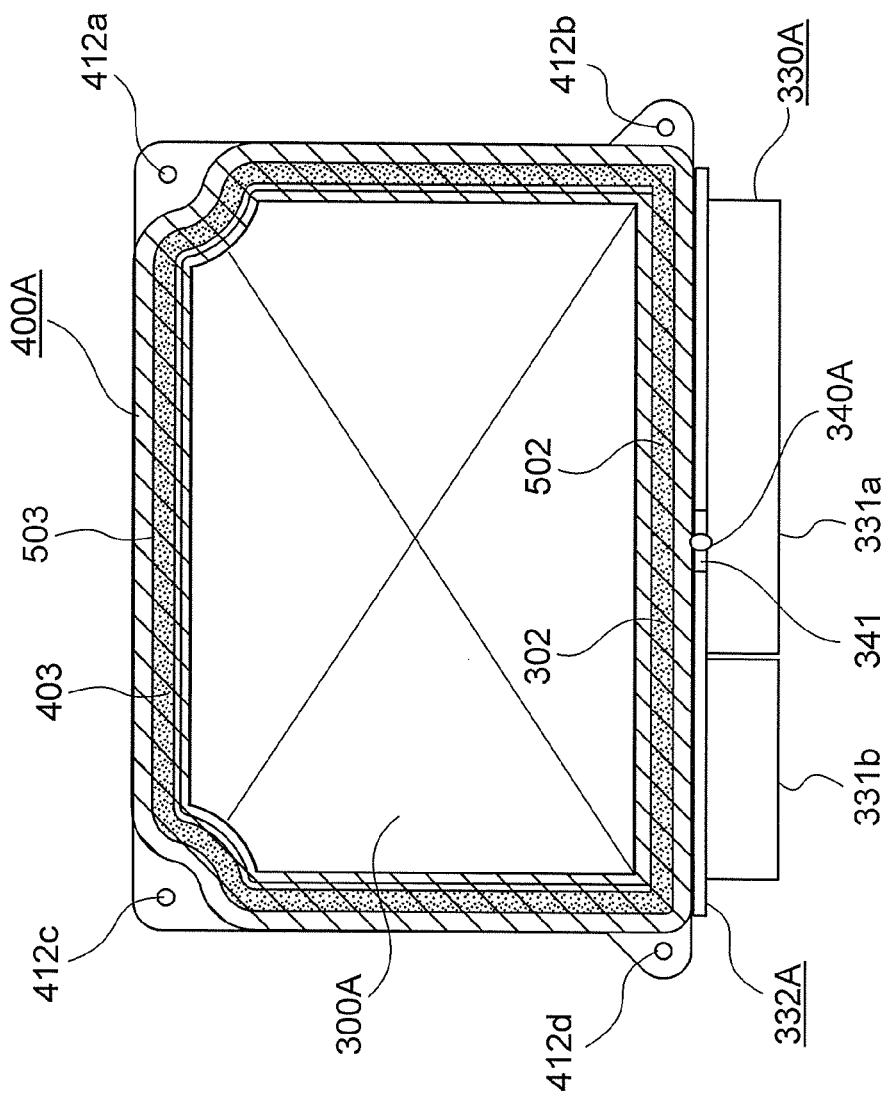

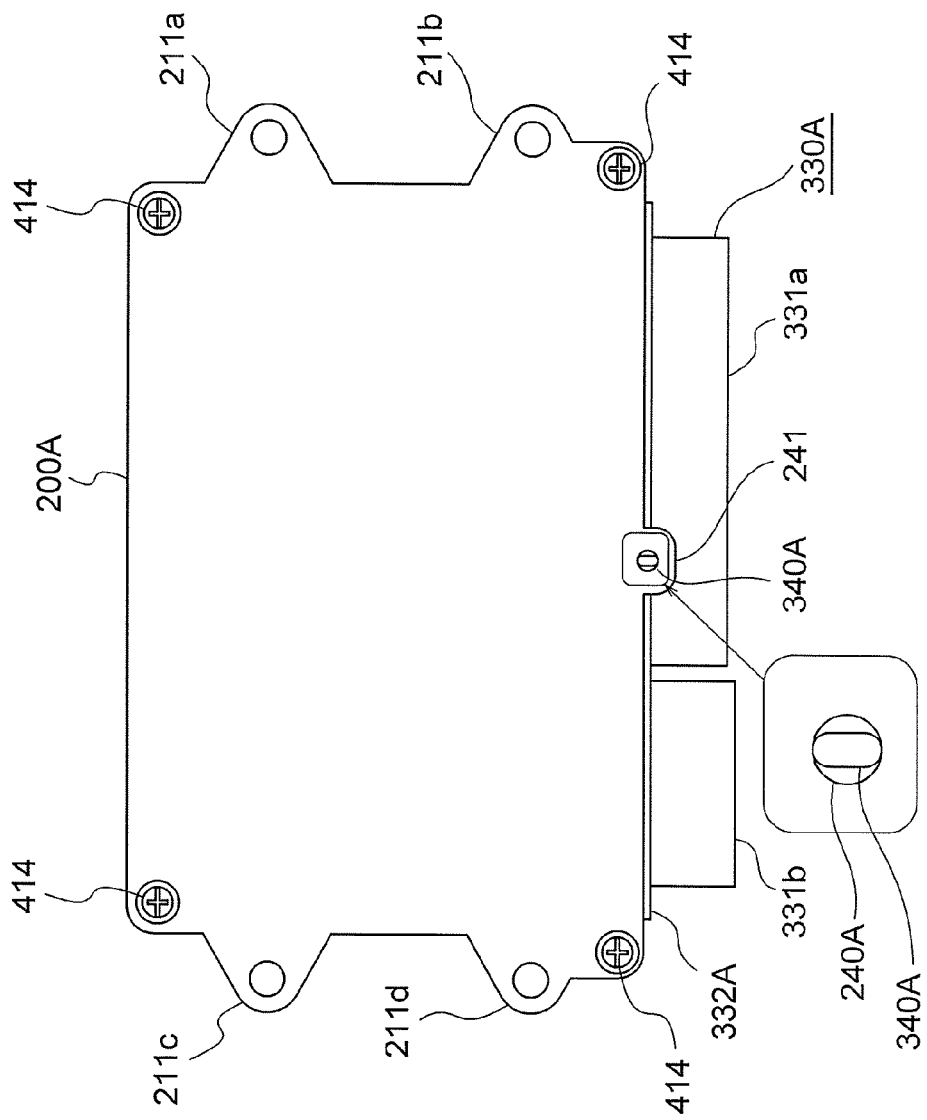

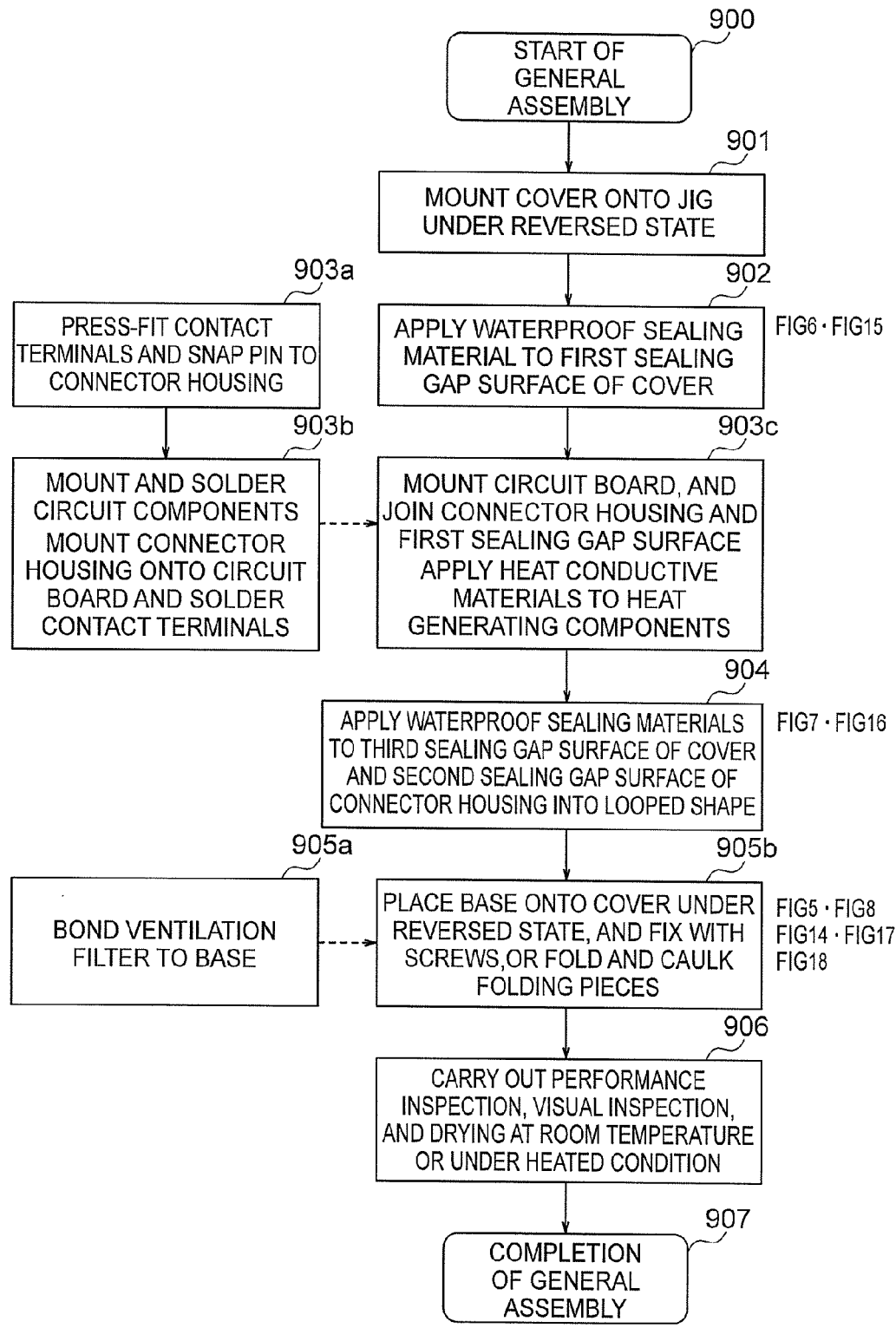

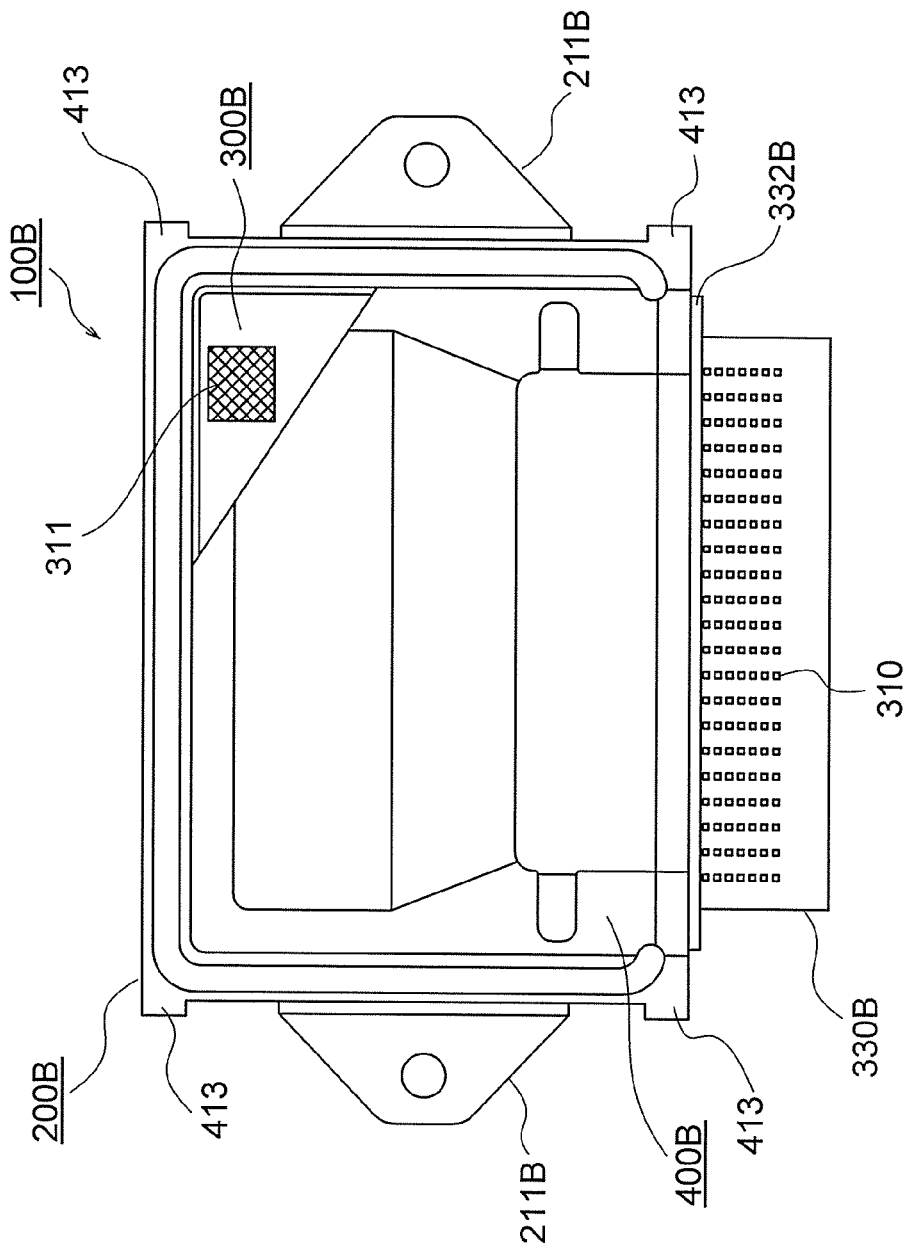

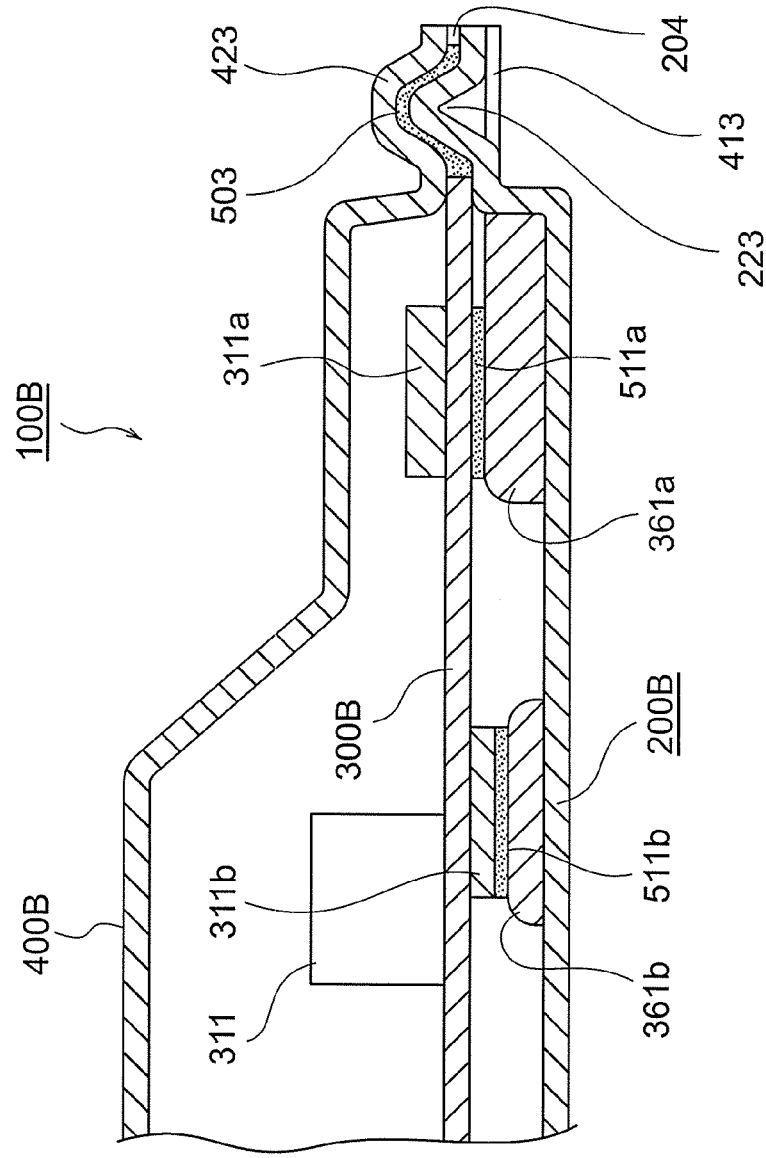

WATERPROOF CONTROL UNIT AND METHOD OF ASSEMBLING THE SAME

BACKGROUND OF THE INVENTION

1. Field of the Invention

The present invention relates to an improvement of a waterproof control unit, which is an on-vehicle electronic control device to be mounted in, for example, an engine compartment, and also relates to an improvement of a method of assembling the waterproof control unit.

2. Description of the Related Art

There have been widely used waterproof control units including a casing including a base and a cover, and a circuit board hermetically housed in the casing, onto which a circuit component and a plurality of external connection contact terminals are mounted, and a connector housing made of a resin forming material is positioned and fixed. The waterproof control units further include, in order to expose, from the casing, an end surface of the connector housing having the plurality of contact terminals passing therethrough, waterproof sealing materials filled into a first sealing gap defined between abutment surfaces of the connector housing and the cover, a second sealing gap defined between abutment surfaces of the connector housing and the base, and a third sealing gap defined between directly-opposing surfaces on respective three sides of the outer peripheries of the base and the cover, respectively. Further, as waterproof sealing surfaces, for example, there has been widely used a convexoconcave sealing surface system including convex-concave-convex threads formed in an outer peripheral contour portion of the cover, and concave-convex-concave threads formed in an outer peripheral contour portion of the base. A waterproof sealing material is filled into a convexoconcave sealing gap defined by loosely fitting the convex thread on one side into the concave thread on the other side.

The first feature of the convexoconcave sealing surface system is that a long water sealing distance (sealing path) is ensured even when the sealing width is small. The second feature of the convexoconcave sealing surface system is that, even when one convex thread wall surface abuts on one concave thread wall surface due to an assembly dimension error between the cover and the base so that the film thickness of the waterproof sealing material becomes zero, the waterproof sealing material is filled in a gap between the other convex thread wall surface and the other concave thread wall surface, and hence a predetermined amount of the waterproof sealing material is securely filled between the wall surfaces on any side.

On the other hand, a drawback of the convexoconcave sealing surface system is as follows. That is, when a fitting depth is increased with respect to a sealing width between convexoconcave sealing surfaces in order to ensure the sealing path, it is difficult for the cover and the base, which are obtained by, for example, cold pressing of an inexpensive sheet metal material, to form narrow, deep, and minute convexoconcave surfaces.

Therefore, the connector housing having a complex shape and having the contact terminals press-fitted thereinto is subjected to hot forming using a resin material, and hence can form a minute convexoconcave sealing surface. However, the connector housing having such a minute convexoconcave sealing surface cannot be used in combination with the cover and the base that are made of the inexpensive sheet metal. Thus, it is necessary to use the base and the cover formed by, for example, aluminum die casting or hot forming of a resin material.

Accordingly, in a case where there is a need to adopt the cover and the base made of the inexpensive sheet metal, there is a problem in that connector housings of different types manufactured by different dies are required.

For example, referring to FIGS. 3 and 1 of an "electronic device" disclosed in Japanese Patent Application Laid-open No. 2009-070855, a printed board 40 having a connector mounted thereonto is housed in a casing, and an inner space of the casing is waterproofed. In an upper case 20 (corresponding to the cover) and a lower case 30 (corresponding to the base) of the casing, as a sealing part that comes in contact with a sealing member, a casing-side recess part 35b is formed in one connector open edge portion, and a casing-side protruding part 25b is formed in the other connector open edge portion. At a surface portion of a housing 51 that faces the connector open edge portions, as a looped sealing part that comes in contact with the sealing member, a connector-side protruding portion 54 to be inserted into the casing-side recess part 35b under a state in which the sealing member is arranged therein and a connector-side recess portion 53 into which the casing-side protruding part 25b is to be inserted under a state in which the sealing member is arranged therein are formed continuously.

This structure is suitable for use of the cover (upper case) made of a resin and the base (lower case) formed by aluminum die casting, and the sealing surfaces of the housing 51 and the upper case 20 and the sealing surfaces of the housing 51 and the lower case 30 are arranged, in a unified manner, on a partition wall of a connector 50 into which connector terminals are press-fitted, and on an outer surface of the partition wall. There is a feature in that the widths of the protruding parts and the recess parts are limited so that a dimension corresponding to the sum of a press-fitting dimension of each of the connector terminals and a contact dimension of each of the connector terminals with those of a mating connector is minimized and thus the connector terminals do not have a long dimension.

Referring to FIG. 3 of a "board housing case for vehicle-mounted electronic device" disclosed in Japanese Patent Application Laid-open No. 2013-004611, a circuit board 40 is hermetically-sealed and housed in a metal case formed of a metal base 30 and a metal cover 20. An undulating concave thread formed in the cover 20 is fitted onto an undulating convex thread formed on a connector housing 41. The undulating convexoconcave sealing surfaces are provided on an inner side of a partition wall of the connector housing 41. An undulating convex thread formed on the base 30 is fitted into an undulating concave thread formed in the connector housing 41. The undulating convexoconcave sealing surfaces are also provided on the inner side of the partition wall of the connector housing 41.

Further, also an outline peripheral portion 23 of the cover 20 and an outline peripheral portion 33 of the base 30 form undulating convexoconcave sealing surfaces including an undulating concave thread and an undulating convex thread that are fitted to each other.

Therefore, the connector housing manufactured by the die can be used in combination with the cover made of a resin or the base formed by aluminum die casting. In this case, the outline peripheral portion 23 of the cover 20 and the outline peripheral portion 33 of the base 30 form convexoconcave sealing surfaces having a narrow width and including a deep concave thread and a tall convex thread that are fitted to each other. Thus, a contour dimension of the vehicle-mounted electronic device can be reduced.

Further, referring to FIGS. 1, 2, and 5 of "seal structure of an electronic control device" disclosed in Japanese Patent Application Laid-open No. 2013-069439, the following electronic control device is disclosed. Specifically, seal portions 50 filled with a sealing material are formed on a joining surface part between peripheral parts of a case 12 and a cover 13 of a housing, which sandwich a circuit board 11 having a connector 15 mounted on one side thereof, and formed on a joining surface part between an outer peripheral surface of the connector 15 and an inner peripheral surface of the housing. A shift suppressing unit 60 is provided to the connector 15 and, among the case 12 and the cover 13, the metal case 12 having higher rigidity than the synthetic resin cover 13. The shift suppressing unit 60 includes a protruding portion 61 and a hollow portion 62 that are fitted to each other, to thereby suppress shifting of the connector 15 with respect to the housing. With this, shifting of the connector is suppressed with respect to the housing, and the load-carrying capacity and sealing performance are enhanced.

This structure uses the resin cover 13 that is inexpensive and lightweight, and the metal case 12 that has a good heat radiating property. A first sealing gap between the cover 13 and the connector 15 is defined between a pair of flat surfaces that allows use of the cover 13 made of a sheet metal material. A third sealing gap between the cover 13 and the case 12 is formed into a sealing gap having a narrow width in such a manner that an outer peripheral bending end surface of the cover 13 is fitted into a concave thread formed in an outer periphery of the case 12.

(1) Description of Problems of Related Art

In the "electronic device" disclosed in Japanese Patent Application Laid-open No. 2009-070855, the convex-concave-convex sealing surface provided on the housing 51, on which the connector-side recess portion 53 to be fitted onto the casing-side protruding part 25b of the upper case 20 is formed at the center, and the concave-convex-concave sealing surface provided on the housing 51, on which the connector-side protruding portion 54 to be fitted into the casing-side recess part 35b of the lower case 30 is formed at the center, pass by and merge with each other at an intermediate portion of the side surface of the housing 51.

Thus, both of the connector opening portion of the upper case 20 and the connector opening portion of the lower case 30 are raised up to the intermediate position on the side surface of the connector. Therefore, when the lower case 30 is formed by, for example, aluminum die casting and the upper case 20 is formed of, for example, a resin forming material, there is a problem in that the entire weight becomes larger.

Further, there is a problem in that the connector formed by the die is not applicable to the casing using the cover (upper case) or the base (lower case) made of a sheet metal material.

In a case of the "board housing case for vehicle-mounted electronic device" disclosed in Japanese Patent Application Laid-open No. 2013-004611, the undulating concave-convex-concave sealing surface provided on the connector housing 41, on which the undulating convex thread on the connector housing side to be fitted into the undulating concave thread of the cover 20 is formed at the center, and the undulating convex-concave-convex sealing surface provided on the connector housing 41, on which the undulating concave thread on the connector housing side to be fitted onto the undulating convex thread of the base 30 is formed at the center, pass by and merge with each other at both end positions on the base 30 in a longitudinal direction of the connector housing 41. Further, the undulating sealing surfaces have a shallow concave thread and a low convex thread as compared to the sealing width. Therefore, there is a problem in that the connector has a long body.

Therefore, in a case where the connector housing manufactured by the die is used in combination with the resin cover or the base formed by aluminum die casting, the connector has an unnecessarily long body, and hence there is a problem in that increase in electrical resistance of a connector pin cannot be suppressed.

In a case of the "seal structure of the electronic control device" disclosed in Japanese Patent Application Laid-open No. 2013-069439, the first sealing gap between the cover 13 and the connector 15 is defined between the pair of flat surfaces having no step, and hence a satisfactory water sealing distance (sealing path) cannot be ensured unless the sealing width is widened. Accordingly, there are problems in that the connector 15 has a long body dimension, and that it is difficult to perform applying work of the waterproof sealing material to the first sealing gap.

Further, the third sealing gap between the cover 13 and the case 12 is formed into the sealing gap having a narrow width in such a manner that the outer peripheral bending end surface of the cover 13 is fitted into the concave thread formed in the outer periphery of the case 12, and hence there is a problem in that the case made of a sheet metal material cannot be used.

In addition, the case 12 is flat, and hence the shift suppressing unit 60 (the protruding portion 61 and the hollow portion 62) for suppressing shifting of the connector 15 with respect to the housing cannot obtain a satisfactory fitting depth. Thus, there is a problem in that, when a gap dimension A between the protruding portion 61 and the hollow portion 62 is increased due to dimension fluctuations of the respective portions, it is impossible to obtain an effect of suppressing shifting of the connector 15 at the time of operation of inserting or removing the mating connector.

SUMMARY OF THE INVENTION (2) Description of Objects of Invention

It is a first object of the present invention to provide a waterproof control unit that uses a common connector housing applicable to both a cover subjected to forming or sheet metal working and a base subjected to forming or sheet metal working, and can ensure a necessary sealing path while preventing the connector housing from having a long body dimension.

It is a second object of the present invention to provide a waterproof control unit in which a sealing gap does not fluctuate significantly due to dimension fluctuations of components, the waterproof control unit being capable of suppressing, in a case where the connector housing is shaken in an up-and-down direction at the time of operation of inserting or removing the mating connector, application of an excessively large external force to the sealing gap so as to prevent sealing surfaces from peeling off, and capable of easily assuming, by visual observation, whether or not a proper amount of a sealing material is filled and applied to the sealing gap.

According to one embodiment of the present invention, there is provided a waterproof control unit, including:
 a base and a cover;
 a circuit board that is hermetically housed in a casing including the base and the cover, and has circuit components mounted thereon;

a connector housing that is positioned and fixed to the circuit board, and allows a plurality of contact terminals to pass therethrough via a partition wall; and a waterproof sealing material filled into each of a first sealing gap defined between opposing surfaces of the connector housing and the cover, a second sealing gap defined between opposing surfaces of the connector housing and the base, and a third sealing gap defined between directly-opposing surfaces of the base and the cover, so as to expose, from an opening portion of a side surface of the cover, an external-connection end surface of the connector housing, in which the connector housing is made of a resin forming material, and a first opposing surface, which includes a flat surface and an inclined surface forming one of the opposing surfaces of the first sealing gap, is formed on three sides of an outer periphery of the connector housing, and in which a second opposing surface, which includes a flat surface and an inclined surface forming one of the opposing surfaces of the second sealing gap, is formed on one remaining side of the outer periphery of the connector housing serving as a bottom surface thereof.

Further, the inclined surface of the first opposing surface includes a slope portion connecting an outer-step flat portion and an inner-step flat portion in a stepped manner, or a first convex thread having a triangular cross-section.

The inclined surface of the second opposing surface includes any one of a slope portion connecting an outer-step flat portion and an inner-step flat portion in a stepped manner, a second concave thread having a trapezoid cross-section, or an undulating deformation portion having a recessed cross-section.

The first opposing surface and the second opposing surface extend across an inner boundary surface of the partition wall toward an inside and an outside of the casing.

The connector housing further includes a looped peripheral wall formed at a position of the outer periphery of the connector housing exposed from the casing, and a pair of side-surface convex threads formed on both side surfaces at a position of an unexposed end surface of the connector housing.

The looped peripheral wall is opposed to an opening side surface of the cover and an end surface of the base with an opening gap (H).

The side-surface convex threads function as plane movement regulating members that are fitted into a pair of side-surface concave threads formed in the cover.

A relative position between the connector housing and the cover is regulated by the plane movement regulating members so that a plane movement gap dimension of the first sealing gap is kept within a predetermined range of fluctuation.

According to one embodiment of the present invention, there is provided a method of assembling the waterproof control unit, in which a central flat surface sandwiched between an outer inclined surface and an inner inclined surface is formed on an inner surface of the cover forming one of gap surfaces of the first sealing gap, and an enlarged gap dimension (GP) between the central flat surface and the connector housing is set to be larger than a first orthogonal gap (G1) at a flat surface situated on an outer side of the outer inclined surface, and than a first orthogonal gap (G1) at a flat surface situated on an inner side of the inner inclined surface, the method including:

a first processing step of mounting the cover onto a jig under a reversed state, and applying, into a non-looped shape, a pasty waterproof sealing material to the central flat surface of the cover;

a second processing step of mounting, onto stepped portions provided on three sides of an outer periphery of the cover, the circuit board having the circuit components and the connector housing mounted and soldered thereonto in advance, to thereby join the connector housing and the cover;

a third processing step of applying, into a looped shape, a pasty waterproof sealing material to a sealing surface defining the third sealing gap of the cover that has been subjected to the second processing step, and a pasty waterproof sealing material to a sealing surface defining the second sealing gap of the connector housing; and a fourth processing step of mounting the base onto the cover that has been subjected to the third processing step, integrating and fixing the cover and the base, and sandwiching and fixing the circuit board by three sides of an outer periphery of the base and the three sides of the outer periphery of the cover, the method further including drying and curing, after finishing the fourth processing step, the pasty waterproof sealing materials by standing at room temperature or heating while carrying out visual inspection and performance inspection.

As described above, the waterproof control unit according to the one embodiment of the present invention is a casing for hermetically housing the circuit board by the base, the cover, and the connector housing. At least the waterproof sealing material in the gap between the connector housing and the cover or between the connector housing and the base is filled in the narrow-gap space defined by the first opposing surface or the second opposing surface, which includes the flat surface and the inclined surface. The narrow-gap space extends across the inner boundary surface of the partition wall of the connector housing, and is defined so as to ensure predetermined waterproof sealing surfaces by the plane movement regulating members.

Therefore, an extending width in a direction of the flat surface is increased as compared to a height of the inclined surface defining the sealing gap, and thus the sealing gap can be defined by a gentle slant portion. Accordingly, the present invention has an effect in that, as compared to a case where the sealing gap is defined between minute and fine convexo-concave sealing surfaces, die structure for the cover or the base to be subjected to forming or sheet metal working can be simplified, and cost of the die can be cut.

Note that, the present invention has effects in that the inclined surface is formed in the sealing surface so that deformation strength of the opening portion of the side surface of the cover is enhanced, and that, as compared to a case where an entire sealing gap is defined between the flat surfaces, the sealing path (sealing surface distance) is elongated so that waterproofing performance can be enhanced.

Further, the relative position between the connector housing and the cover is regulated by the plane movement regulating members. Accordingly, the present invention has an effect in that, in a case where the connector housing is shaken in the up-and-down direction at the time of operation of inserting or removing the mating connector, application of an excessively large external force to the sealing gap is suppressed so that it is possible to prevent the sealing surfaces from peeling off.

Further, the present invention has effects in that it is possible to assume whether or not a proper amount of the waterproof sealing material is applied by visual observation of an overflow degree of the waterproof sealing material in the opening gap defined by the looped peripheral wall, and that it is possible to perform waterproofing with stable performance through gap regulation and control of the sealing material within the proper amount.

As described above, according to the assembling method of the present invention, after the waterproof sealing material is applied to the sealing surface defining the first sealing gap of the cover, the circuit board having the connector housing is mounted on the cover. Subsequently, the waterproof sealing material is applied, into a looped shape, to the sealing surface defining the third sealing gap of the cover and the sealing surface housing defining the second sealing gap of the connector, and then the cover and the connector housing are coupled together. After an entire assembly is integrated and fixed, visual inspection and performance inspection are performed.

Therefore, the present invention has an effect in that joining is conducted directly after the waterproof sealing material is applied, and hence joining failure caused by drying of the waterproof sealing material does not occur. Further, the present invention has an effect in that, in the first processing step as a main control step, the waterproof sealing material can be applied to a correct position, and in the second processing step subsequent to the first processing step, a proper amount of the waterproof sealing material can be fed and distributed under pressure to the first sealing gap surface of the connector housing to inner and outer sides of the connector housing.

Further, the present invention has an effect in that it is possible to determine whether or not a proper amount of the waterproof sealing material is applied to a proper sealing gap by carrying out image determination using an electron camera or visual inspection of an overflow degree of the waterproof sealing material in the opening gap H defined by the looped peripheral wall portion of the connector housing.

BRIEF DESCRIPTION OF THE DRAWINGS

FIG. 5 is a sectional view illustrating the inverted connector housing taken along the line D-D of FIG. 4A.

FIG. 6 is a view illustrating an inner surface of a cover of FIG. 1.

FIG. 7 is a plan view illustrating combination of the cover and a circuit board of FIG. 1.

FIG. 8 is a plan view illustrating combination of the cover, the circuit board, and a base of FIG. 1.

FIG. 9 is a flow chart illustrating assembly of the waterproof control unit according to the present invention.

FIG. 10 is an external view illustrating a waterproof control unit according to a second embodiment of the present invention.

FIG. 11 is a partially side sectional view illustrating the waterproof control unit of FIG. 10.

DETAILED DESCRIPTION OF THE PREFERRED EMBODIMENTS

First Embodiment (1) Detailed Description of Configuration

Figure 1:
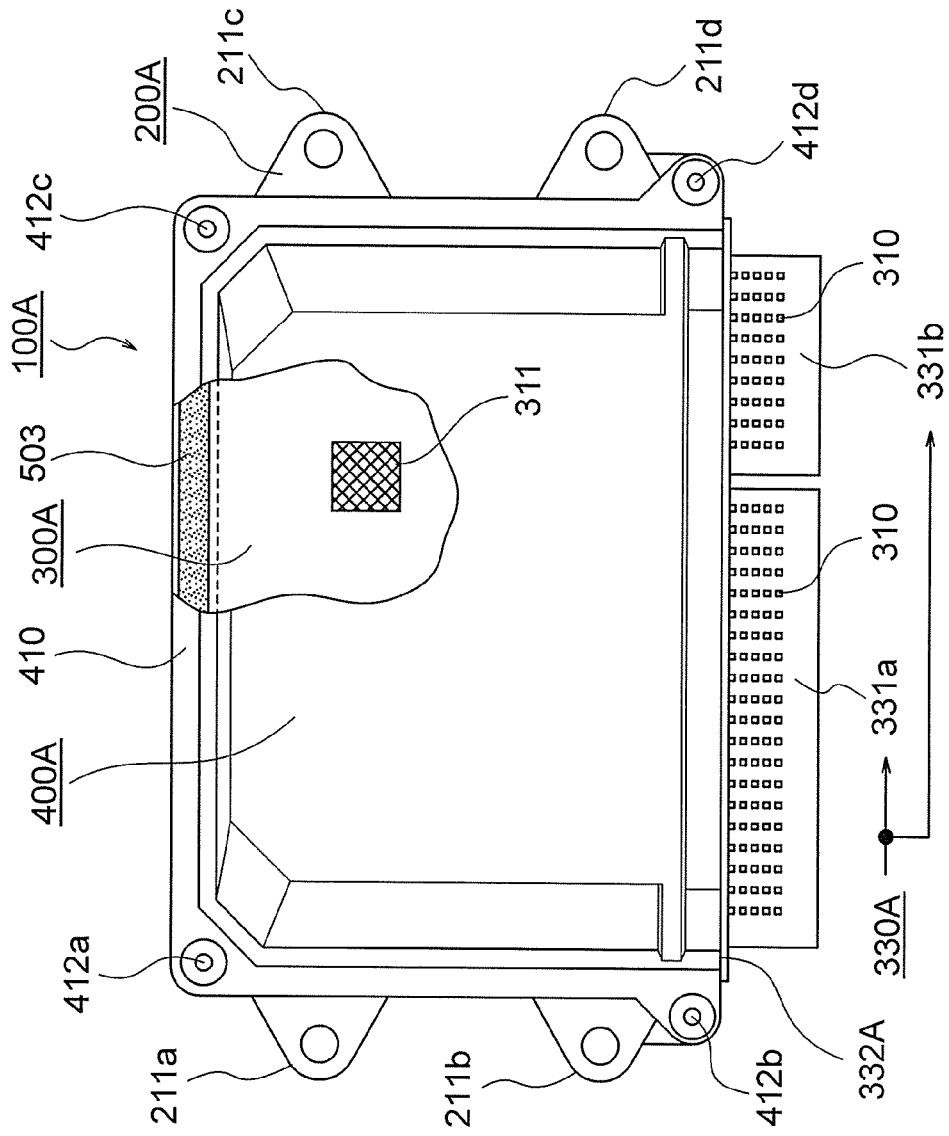
FIG. 1 is an external view illustrating a waterproof control unit according to a first embodiment of the present invention.
Figure 2:
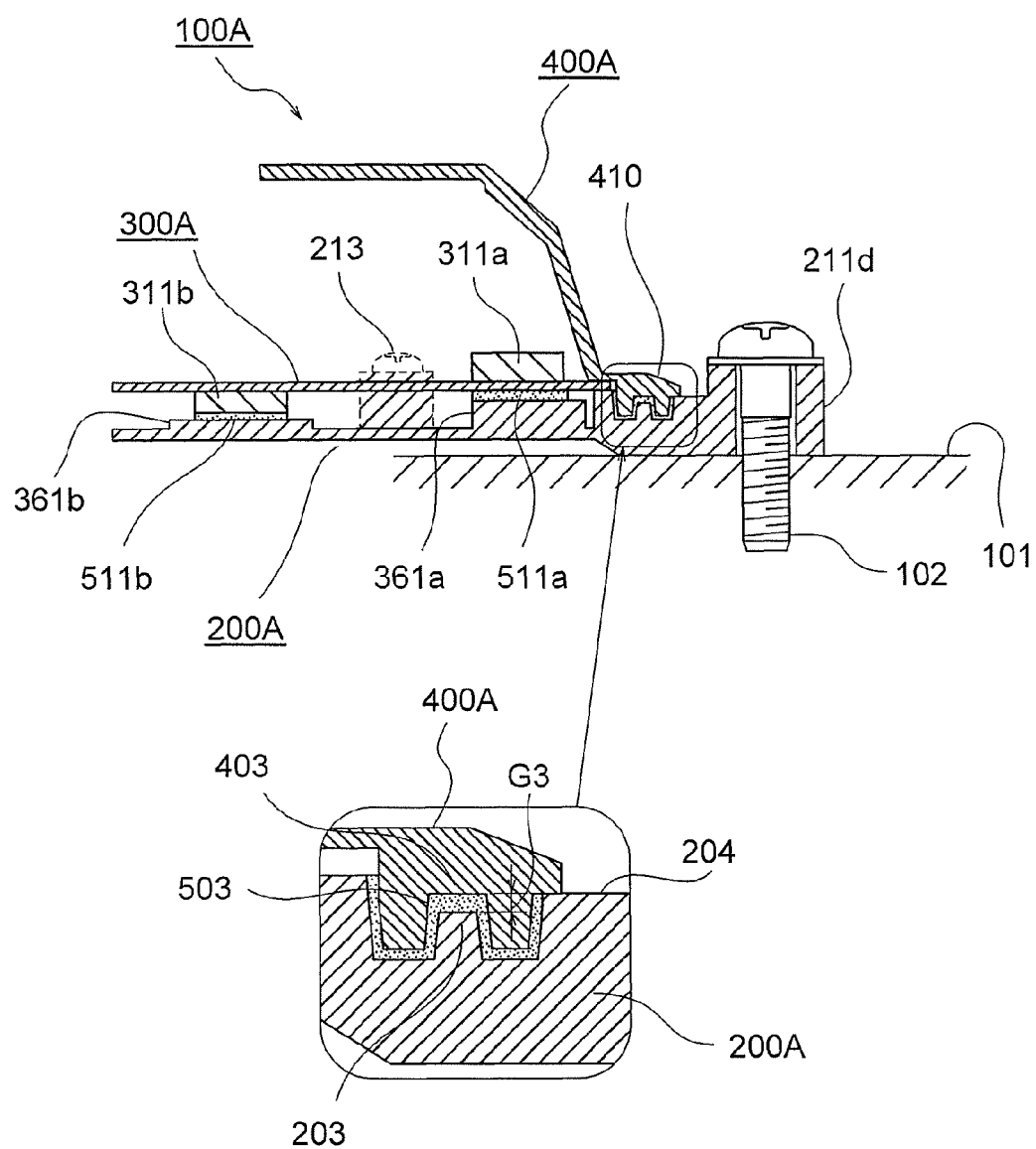
FIG. 2 is a view illustrating a mounting structure of the waterproof control unit of FIG. 1.
Figure 3:
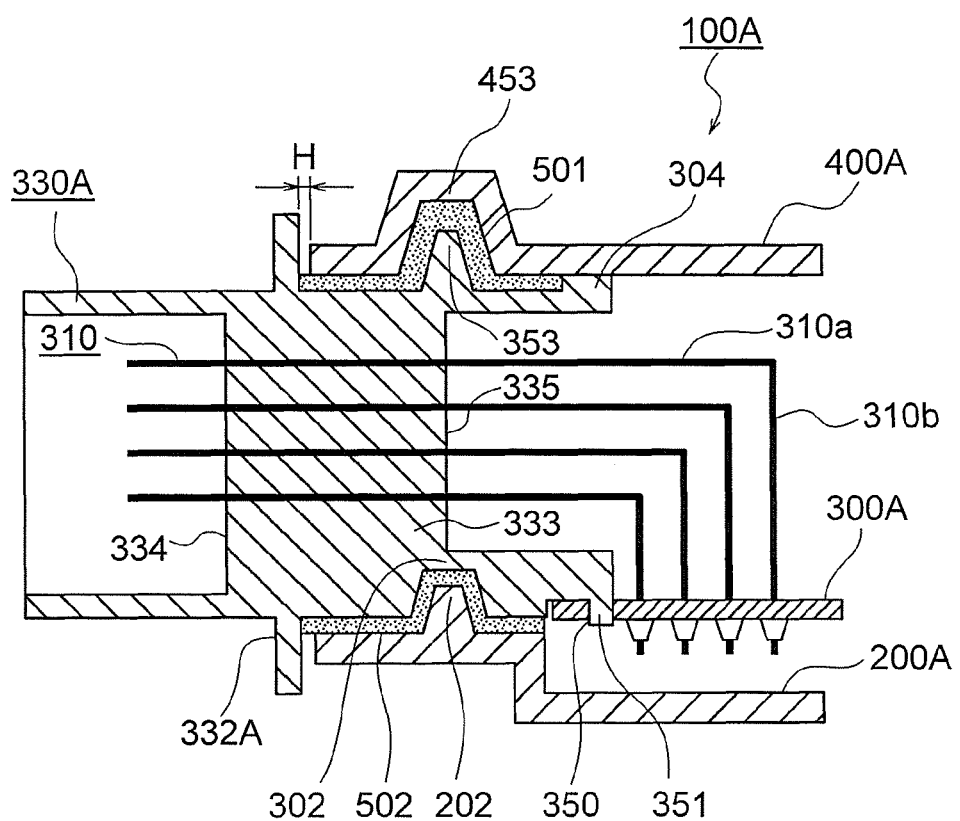
FIG. 3 is a detailed sectional view illustrating a connector housing of FIG. 1.
Figure 4A:
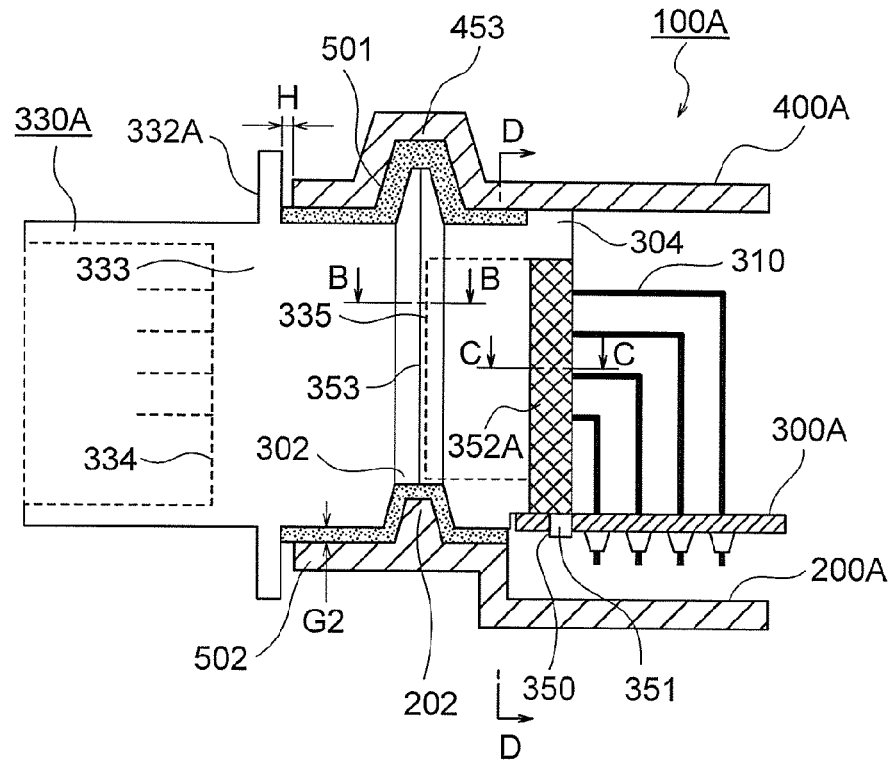
FIG. 4A is a further detailed sectional view illustrating the connector housing of FIG. 3.

First, descriptions are sequentially made of FIG. 1, which is an external view illustrating a waterproof control unit according to a first embodiment of the present invention, FIG. 2, which is a view illustrating a mounting structure of the waterproof control unit of FIG. 1, FIG. 3, which is a detailed sectional view illustrating a connector housing of FIG. 1, FIGS. 4A to 4C, which are further detailed sectional views illustrating the connector housing of FIG. 3, and FIG. 5, which is a sectional view illustrating the connector housing taken along the line D-D of FIG. 4A.

In FIG. 1, a waterproof control unit 100A includes a base 200A, a circuit board 300A, and a cover 400A. The base 200A includes four mounting legs 211a to 211d, and is formed by aluminum die casting. A plurality of circuit components 311 and heat generating components 311a and 311b described later are mounted on the circuit board 300A. The cover 400A includes a flange 410 on three outer peripheral wall portions, and is made of resin. The remaining one outer peripheral wall portion of the cover 400A is not provided, and an opening portion closed by a connector housing 330A is formed instead.

The connector housing 330A including first and second connector housings 331a and 331b integrally formed is attached to one side of the circuit board 300A.

Looped peripheral walls 332A described later with reference to FIGS. 3 and 4A are provided in a projecting manner on outer peripheries of the first and second connector housings 331a and 331b, respectively.

Further, screw holes 412a to 412d formed in the cover 400A are described later with reference to FIG. 5, and a waterproof sealing material 503 is described later with reference to FIG. 2.

In FIG. 2, the circuit board 300A is sandwiched between respective three sides of outer peripheries of the cover 400A and the base 200A, and is fastened and fixed therebetween, with coupling screws 414 described later with reference to FIG. 5, from a back surface side of the base 200A through the screw holes 412a to 412d (see FIGS. 1 and 5) formed in four corners of the cover 400A.

Note that, as indicated by the dotted line of FIG. 2, the circuit board 300A can be fixed with a fixing screw 213 to a mounting base portion provided on an inner surface of the base 200A.

Note that, a third concave thread 403 formed in the three sides of the outer periphery of the cover 400A, and a third convex thread 203 formed on the three sides of the outer periphery of the base 200A are fitted to each other to form a third sealing gap. The waterproof sealing material 503 is applied to the fitted surfaces.

Note that, the cover 400A abuts on a gap-setting abutment surface 204 of the base 200A, to thereby define a third orthogonal gap G3 in the third sealing gap to which the waterproof sealing material 503 is to be applied.

Note that, as a design value of the third orthogonal gap G3, the same value as those of a first orthogonal gap G1 and a second orthogonal gap G2 described later with reference to FIGS. 4A to 4C, FIGS. 13A to 13C, and FIGS. 21A to 21C is adopted, and the same sealing gap G3 is employed all over the third sealing gap.

This holds true for a case of an undulating deformation system described later with reference to FIG. 11 and a case of a step-slope system described later with reference to FIG. 19.

Mounting screws 102 for mounting and fixing the waterproof control unit 100A to a mounting surface 101 are inserted into loose holes of the four mounting legs 211a to 211d formed to the base 200A, and are tightened into screw holes of the mounting surface 101 with a screw fastening tool (not shown).

The circuit board 300A includes the first heat generating component 311a mounted on a board surface on the cover 400A side, and the second heat generating component 311b mounted on a board surface on the base 200A side. The base 200A includes a first heat transfer base portion 361a adjacent to a bottom surface of the first heat generating component 311a through intermediation of the circuit board 300A, and a second heat transfer base portion 361b directly adjacent to a back surface of the second heat generating component 311b. Heat conductive adhesives 511a and 511b are applied to surfaces of the first and second heat transfer base portions 361a and 361b, respectively.

In FIG. 3, the connector housing 330A representing the first and second connector housings 331a and 331b includes the looped peripheral wall 332A described above with reference to FIG. 1, and a partition wall 333 to which contact terminals 310 of a right-angle type are press-fitted.

A mating connector (not shown) is inserted at a position on an outer side of an outer boundary surface 334 of the partition wall 333, and mating contact terminals are inserted to establish contact connection to ends of the contact terminals 310 on one side.

Horizontal portions 310a and perpendicular portions 310b of the contact terminals 310 are arranged on an inner side of an inner boundary surface 335 of the partition wall 333 under a state in which the horizontal portions 310a and the perpendicular portions 310b are exposed in a space. Distal ends of the perpendicular portions 310b pass through the front and back surfaces of the circuit board 300A, and are connected on the back surface side by soldering.

Note that, when the perpendicular portions 310b of the contact terminals 310 are expanded and contracted due to a change in ambient temperature, the horizontal portions 310a are curved so as to prevent breakage of the solder-connection portion between the perpendicular portions 310b and the circuit board 300A. When the horizontal portions 310a of the contact terminals 310 are expanded and contracted due to a change in ambient temperature, the perpendicular portions 310b are curved so as to prevent stress from being applied to the press-fitting portion between the horizontal portions 310a and the partition wall 333.

Further, on both sides of a left side of the circuit board 300A, a board engagement portion 350, which is a board hole or a cutout portion, is provided. A positioning protrusion piece 351 such as a snap pin press-fitted to the connector housing 330A is fitted to the board engagement portion 350 so as to regulate a relative mounting position between the connector housing 330A and the circuit board 300A.

At a left opening portion of the cover 400A where a part of the connector housing 330A is exposed, a first concave thread 453 having a trapezoid cross-section is formed. The first concave thread 453 is fitted and opposed to a first convex thread 353 on the connector housing 330A side, to thereby define a first sealing gap. A waterproof sealing material 501 is applied in the first sealing gap.

Note that, the first concave thread 453 and the first convex thread 353 each include a flat portion extending in a right-and-left direction of FIG. 3. The first sealing gap is defined between the first concave thread 453 and the first convex thread 353 each including the flat portion. The waterproof sealing material 501 is applied in a range beyond the inner boundary surface 335 of the partition wall 333 (in a range extending in the right-and-left direction of FIG. 3 to the outer boundary surface 334 side with respect to the inner boundary surface 335 and to the perpendicular portion 310b side of the contact terminals 310 with respect to the inner boundary surface 335).

Further, at a terminal end position of the inner flat portion (right side of FIG. 3) of the connector housing 330A, a plurality of gap-setting protrusions 304 are provided in a projecting manner, and abut on an inner surface of the cover 400A, to thereby restrict such a situation where the first sealing gap becomes extremely small.

The gap-setting protrusions 304 may be provided onto the inner surface side of the cover 400A, or may be provided onto the outer flat portion (left side of FIG. 3) of the connector housing 330A or the cover 400A.

Further, the gap-setting protrusions 304 may overlap with a boundary position of the waterproof sealing material 501 so that a part of the gap-setting protrusions 304 is included in the region where the waterproof sealing material 501 is applied.

A second concave thread 302 for defining a second sealing gap together with the base 200A is provided in a bottom surface of the connector housing 330A, and a second convex thread 202 loosely fitted into the second concave thread 302 is provided onto a left side of the base 200A. In the second sealing gap defined by the second concave thread 302 and the second convex thread 202, a waterproof sealing material 502 is applied.

Note that, the second sealing gap is regulated in such a way that a cutout portion 341 and a protrusion piece 241, which are described later with reference to FIGS. 7 and 8, abut on each other in an opposing manner.

Note that, the second sealing gap may be regulated by a height of a mounting surface of the circuit board 300A and the base 200A. In this case, the gap regulating member for the second sealing gap may be omitted.

The looped peripheral wall 332A of the connector housing 330A is opposed to respective left end surfaces of the cover 400A and the base 200A with an opening gap H. When the first sealing gap and the second sealing gap are proper and filling and applying amounts of the waterproof sealing materials 501 and 502 are proper, the waterproof sealing materials 501 and 502 overflow from a bottom of the opening gap H up to a predetermined outer surface position.

Therefore, the presence and absence of abnormality of waterproofing can be determined by monitoring overflow amounts of the waterproof sealing materials 501 and 502 in the opening gap H.

In FIG. 4A, with respect to the second orthogonal gap G2 defined between a flat portion connected to an inner or outer side of the second convex thread 202 and a flat portion connected to an inner or outer side of the second concave thread 302, a gap dimension between slant portions in a horizontal direction (right-and-left direction of FIGS. 4A to 4C), and a gap dimension between a top surface of the second convex thread 202 and an inner bottom surface of the second concave thread 302 are designed to have the same value as that of the second orthogonal gap G2. The second orthogonal gap G2 has the same value as that of the first orthogonal gap G1 described later.

Figure 4B:
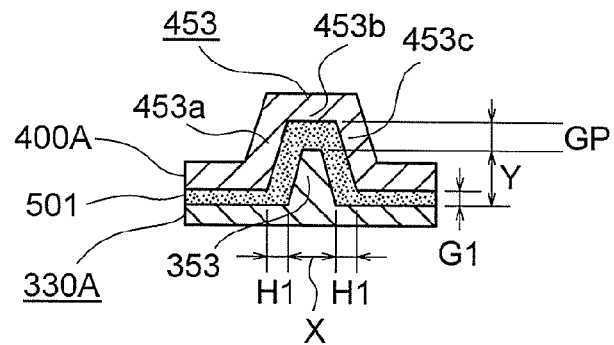
FIG. 4B is a sectional view illustrating the connector housing taken along the line B-B of FIG. 4A.

In FIG. 4B, which is a partially sectional view taken along the line B-B of FIG. 4A, a value of a convex thread bottom surface width X of the first convex thread 353 having a triangular cross-section is equal to or larger than a value of a convex thread height Y, and thus a relation of X≥Y is satisfied. Note that, an apex of the triangular shape is chamfered as appropriate.

The first concave thread 453 includes an outer inclined surface 453a, a central flat surface 453b, and an inner inclined surface 453c. A gap dimension between the cover 400A and the connector housing 330A at a flat portion situated on a further outer side (left side of FIG. 4A) of the outer inclined surface 453a, and a gap dimension between the cover 400A and the connector housing 330A at a flat portion situated on a further inner side (right side of FIG. 4A) of the inner inclined surface 453c are each represented by the first orthogonal gap G1.

Further, a gap dimension between a top portion of the first convex thread 353 and the central flat surface 453b of the first concave thread 453 is represented by an enlarged gap dimension GP, and a gap dimension in the horizontal direction (right-and-left direction of FIGS. 4A to 4C) between respective slant portions of the first convex thread 353 and the first concave thread 453 is represented by a first horizontal gap H1.

Note that, respective values of the first orthogonal gap G1, the first horizontal gap H1, and the enlarged gap dimension GP satisfy, for example, a relation of H1=GP≥2×G1.

Figure 4C:
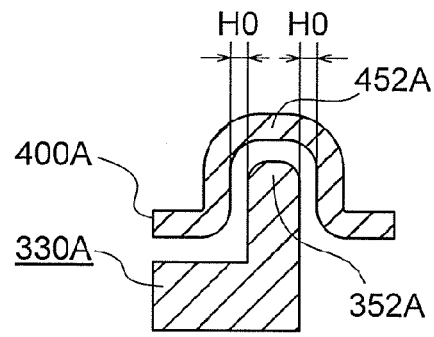
FIG. 4C is a sectional view illustrating the connector housing taken along the line C-C of FIG. 4A.

In FIG. 4C, which is a partially sectional view taken along the line C-C of FIG. 4A, a side-surface convex thread 352A is formed on each oblique side portion of the trapezoid of the connector housing 330A (see FIG. 5) having an exposed end surface of a trapezoid shape, and a side-surface concave thread 452A into which the side-surface convex thread 352A is fitted is formed in the cover 400A.

A movement margin dimension H0, which is a right or left gap dimension between the side-surface convex thread 352A and the side-surface concave thread 452A, is designed to always satisfy a relation of H0<H1.

Therefore, even when there are dimension fluctuations of the respective portions and dimension errors of assembly, the movement margin dimension H0 strictly restricts a relative position between the connector housing 330A and the cover 400A, and thus prevents occurrence of such a situation where dimension fluctuations of the right and left first horizontal gaps H1 become extremely large so that one of the horizontal gaps becomes zero to cause abutment of the inclined surfaces.

FIG. 5, which is obtained by inverting a partially sectional view taken along the line D-D of FIG. 4A, illustrates the following state. Specifically, as described later with reference to FIG. 7, after the waterproof sealing material 501 is applied to a first sealing gap surface of the cover 400A that is reversed, an intermediate assembly body formed of the connector housing 330A and the circuit board 300A is inserted into the cover 400A. Subsequently, the waterproof sealing material 502 and the waterproof sealing material 503 are applied into a looped shape to a second sealing gap surface of the connector housing 330A and a third sealing gap surface of the cover 400A, respectively, and then the base 200A is mounted. Then, the coupling screws 414 are tightened into the screw holes 412a to 412d (regarding the screw holes 412b and 412d, see FIG. 1) formed in the four corners of the cover 400A.

Note that, in the above description, the third sealing gap defined between directly-opposing surfaces of the cover 400A and the base 200A is defined between the third convex thread 203 and the third concave thread 403 illustrated in FIG. 2. Instead of this, there may be adopted an undulating deformation portion 223 having a convex thread form and an undulating deformation portion 423 having a concave thread form, which are described later with reference to FIG. 11. Alternatively, the third sealing gap may be defined between a slope portion 203b and a slope portion 403b, which are described later with reference to FIG. 19.

(2) Description of Assembling Method

Next, a method of assembling the waterproof control unit 100A configured as illustrated in FIGS. 1 to 5 is described in detail with reference to FIG. 9 illustrating a flowchart of assembly and FIGS. 6 to 8 illustrating states of intermediate steps of assembly.

In FIG. 6, which is a view illustrating an inner surface of the cover 400A, the first concave thread 453 illustrated in FIGS. 3 and 4A to 4C is formed in an opening end (on a lower side of FIG. 6) of the cover 400A. The pasty waterproof sealing material 501 is applied to the first concave thread 453.

Note that, the opening end of the cover 400A is formed into a trapezoid shape. FIG. 6 illustrates by the straight lines such a solid shape that a short top surface of the trapezoid is recessed in a direction of a back of the drawing sheet, and right and left inclined surfaces extending from the short top surface reach a front of the drawing sheet.

The third sealing gap surface formed of the third concave thread 403 illustrated in FIG. 2 is formed on the three sides of the outer periphery of the cover 400A. In FIG. 6, the waterproof sealing material 503 is not applied to the third sealing gap surface yet.

In FIG. 7 illustrating a state in which the circuit board 300A is mounted to the cover 400A, the circuit components 311 (not shown in FIG. 7, see FIG. 1), the first and second heat generating components 311a and 311b (not shown in FIG. 7, see FIG. 2), and the connector housing 330A are mounted and assembled to the circuit board 300A. The connector housing 330A is mounted on a back surface side of the circuit board 300A illustrated in FIG. 7.

Note that, the cutout portion 341 is formed in the looped peripheral wall 332A of the connector housing 330A (which collectively refers to the first connector housing 331a and the second connector housing 331b), and a positioning protrusion 340A is provided on the cutout portion 341 in a projecting manner.

The pasty waterproof sealing materials 502 and 503 are applied into a looped shape to the second concave thread 302 of the connector housing 330A and the third concave thread 403 of the cover 400A, respectively.

In FIG. 8, which is a back view illustrating a state in which the cover 400A, the circuit board 300A, and the base 200A are integrated together, the protrusion piece 241 is formed on the base 200A. The protrusion piece 241 is fitted into the cutout portion 341 (see FIG. 7) of the connector housing 330A, and the positioning protrusion 340A of the connector housing 330A is fitted into a positioning fitting hole 240A formed in the protrusion piece 241.

Note that, the positioning protrusion 340A has an elliptic shape. When the positioning protrusion 340A is fitted into the positioning fitting hole 240A, even when fitting is performed slightly forcibly, distal end portions of a major axis of the ellipse are trimmed so that the positioning protrusion 340A can be fitted into the positioning fitting hole 240A.

As a result, a relative position between the base 200A and the connector housing 330A is determined by a fitting state of the positioning fitting hole 240A and the positioning protrusion 340A serving as plane movement regulating members. The respective inclined surfaces of the second convex thread 202 and the second concave thread 302 illustrated in FIG. 3 are not held in contact with each other, and thus the waterproof sealing material 502 is filled laterally evenly.

Next, description is made of FIG. 9, which is a flow chart illustrating assembly of the waterproof control unit according to the first embodiment of the present invention.

In FIG. 9, Step 900 is a start step for work of assembling the waterproof control unit 100A. Prior to the start step 900, preparation steps 903a, 903b, and 905a are carried out.

The preparation step 903a is a step of press-fitting and fixing the large number of contact terminals 310 to the partition wall 333 of the connector housing 330A, and press-fitting the positioning protrusion piece 351 such as a snap pin to the connector housing 330A and fitting and fixing the positioning protrusion piece 351 to the board engagement portion 350 of the circuit board 300A.

The preparation step 903b is a step of mounting and soldering the heat generating components 311a and 311b and the large number of circuit components 311 onto the circuit board 300A, and soldering the ends of the contact terminals 310 on one side onto lands provided to the circuit board 300A, to thereby finish an "intermediate assembly body of the circuit board."

The preparation step 905a is a step of bonding and fixing in advance a ventilation filter (not shown) to an inner bottom surface of the base 200A with an adhesive.

Step 901 subsequent to the start step 900 is a step of reversing the cover 400A and mounting the cover 400A onto an assembly jig.

Step 902 subsequent to Step 901 is a first processing step of applying the waterproof sealing material 501 to the first sealing gap surface of the cover 400A (see FIG. 6).

Step 903c subsequent to Step 902 is a second processing step of mounting, onto the inner surface of the cover 400A, the "intermediate assembly body of the circuit board" that is finished in the preparation step 903b, and joining, to the mating surfaces, and the waterproof sealing material 501 applied in Step 902.

Further, as an additional processing step performed in the second processing step, the heat conductive adhesives 511a and 511b are respectively applied to a surface of the circuit board 300A at the back of a mounting position of the heat generating component 311a, and to a surface of the heat generating component 311b.

In the additional processing step, applying work is performed under a state in which the circuit board 300A is covered with a transparent jig plate having window holes through which the heat conductive adhesives 511a and 511b are applied.

Step 904 subsequent to Step 903c is a third processing step of applying the pasty waterproof sealing materials 502 and 503 to the third sealing gap surface of the cover 400A and the second sealing gap surface of the connector housing 330A through a route of a looped shape (see FIG. 7).

Step 905b subsequent to Step 904 is a fourth processing step of mounting, onto the cover 400A under a reversed state, the base 200A having the ventilation filter bonded and fixed thereto in the preparation step 905a, joining, to the mating surfaces, the heat conductive adhesives 511a and 511b applied in Step 903c and the waterproof sealing materials 502 and 503 applied in Step 904, and integrating and fixing the cover 400A and the base 200A with the coupling screws 414 (see FIGS. 5 and 8).

Step 906 subsequent to Step 905b is a step of carrying out initial setting, performance inspection, and visual inspection of the waterproof control unit 100A while drying, at room temperature or under a heated condition, the heat conductive adhesives 511a and 511b applied in Step 903c, the waterproof sealing material 501 applied in Step 902, and the waterproof sealing materials 502 and 503 applied in Step 904. Thus, the processing proceeds to a general assembly completion step 907.

Note that, as the visual inspection, it is determined whether or not the cover 400A, the connector housing 330A, and the base 200A have a proper relative positional relationship and whether or not degrees of filling of the waterproof sealing materials 501 and 502 are proper by inspecting overflow degrees of the waterproof sealing materials 501 and 502 in the opening gaps H (see FIGS. 3 and 4A) defined between the looped peripheral wall 332A of the connector housing 330A and an end surface of the cover 400A and between the looped peripheral wall 332A and an end surface of the base 200A, and by carrying out visual determination or automatic determination using image recognition through comparison with a standard sample.

(3) Main Points and Features of First Embodiment

As is apparent from the above description, the waterproof control unit 100A according to the first embodiment of the present invention includes:

the base 200A and the cover 400A;

the circuit board 300A that is hermetically housed in a casing including the base 200A and the cover 400A, and has the circuit components 311 mounted thereon;

the connector housing 330A that is positioned and fixed to the circuit board 300A, and allows the plurality of contact terminals 310 to pass therethrough via the partition wall 333; and waterproof sealing materials 501, 502, and 503 filled into the first sealing gap defined between opposing surfaces of the connector housing 330A and the cover 400A, the second sealing gap defined between opposing surfaces of the connector housing 330A and the base 200A, and the third sealing gap defined between directly-opposing surfaces of the base 200A and the cover 400A, so as to expose, from an opening portion of a side surface of the cover 400A, an external-connection end surface of the connector housing.

The connector housing 330A is made of a resin forming material, and a first opposing surface, which includes a flat surface and an inclined surface forming one of the opposing surfaces of the first sealing gap, is formed on three sides of an outer periphery of the connector housing.

A second opposing surface, which includes a flat surface and an inclined surface forming one of the opposing surfaces of the second sealing gap, is formed on one remaining side of the outer periphery of the connector housing 330A serving as a bottom surface thereof.

The inclined surface of the first opposing surface includes the first convex thread 353 having a triangular cross-section.

The inclined surface of the second opposing surface includes the second concave thread 302 having a trapezoid cross-section.

The first opposing surface and the second opposing surface extend across the inner boundary surface 335 of the partition wall 333 toward an inside and an outside of the casing.

The connector housing 330A further includes the looped peripheral wall 332A formed at a position of the outer periphery of the connector housing exposed from the casing, and the pair of side-surface convex threads 352A formed on both side surfaces at a position of an unexposed end surface of the connector housing.

The looped peripheral wall 332A is opposed to the opening side surface of the cover 400A and the end surface of the base 200A with the opening gap H.

The side-surface convex threads 352A function as the plane movement regulating members that are fitted into the pair of side-surface concave threads 452A formed in the cover 400A.

A relative position between the connector housing 330A and the cover 400A is regulated by the plane movement regulating members so that a plane movement gap dimension of the first sealing gap is kept within a predetermined range of fluctuation.

Therefore, the waterproof control unit 100A according to the first embodiment includes the cover 400A formed of a resin product, and the base 200A formed by aluminum die casting. Thus, the waterproof control unit 100A increases a heat dissipating property to the base 200A, and narrows the third sealing gap surface formed on the three sides of the outer periphery, to thereby have a configuration suitable for downsizing of the waterproof control unit 100A.

The connector housing 330A includes the partition wall 333, into which the plurality of contact terminals 310 of a right-angle type are press-fitted. The end surface of the connector housing has a trapezoid shape. A long base of the trapezoid is positioned by the positioning protrusion piece 351 and the board engagement portion 350, and is fixed to one side of the circuit board 300A, and a portion of the connector housing projecting beyond the one side of the circuit board 300A is opposed to the base 200A via the second sealing gap. A short top side and right and left oblique sides of the trapezoid are opposed to the opening portion of the side surface of the cover 400A via the first sealing gap.

At least apart of the flat portion continuous with the inner inclined surface of the first convex thread 353 defining the first sealing gap extends beyond the inner boundary surface 335 of the partition wall 333 toward the inside of the casing.

At least apart of the flat portion continuous with the inner inclined surface of the second concave thread 302 defining the second sealing gap extends beyond the inner boundary surface 335 of the partition wall 333 toward the inside of the casing.

As described above, in relation to claim 2 of the present invention, the plurality of contact terminals of a right-angle type are press-fitted and fixed into the partition wall of the connector housing. The end surface of the connector housing has a trapezoid shape. The first sealing gap between the connector housing and the cover and the second sealing gap between the connector housing and the base extend toward the inside of the casing beyond the inner boundary surface of the partition wall.

Therefore, the present invention has the following features. The first and second sealing gaps are elongated using an idle space formed around the extending inner horizontal portions of the contact terminals, and thus it is possible to ensure a sealing surface distance even when the slant portions defining the sealing gap have gentle inclinations. Further, sealing surfaces can be formed with simple die structure.

Further, the present invention has the following features. The connector housing has a trapezoid shape, and hence an idle space is formed at the oblique side portion on a long base side. Thus, it is easy to arrange the side-surface convex thread and the side-surface concave thread serving as the plane movement regulating members, and it is easy to apply the waterproof sealing material in the first sealing gap formed in the opening portion of the side surface of the cover.

The plurality of gap-setting protrusions 304 are interspersed on one of the connector housing 330A and the cover 400A defining the first sealing gap, and abut on another one of the connector housing 330A and the cover 400A.

The gap-setting protrusions 304 are provided at a terminal end position of an inner surface of the casing to which the waterproof sealing material 501 is applied, and function as members for regulating a gap in a direction orthogonal to the first sealing gap.

As described above, in relation to claim 3 of the present invention, a sealing gap dimension of the first sealing gap is regulated by the plurality of gap-setting protrusions interspersed at a terminal end position of the waterproof sealing material.

Therefore, the present invention has features in that the flow of the waterproof sealing material is not hindered by the gap-setting protrusions in the sealing gap, that the waterproof sealing material can be applied evenly, and that the sealing gap dimension can be regulated within a predetermined value so as not to become extremely small.

This holds true for second and third embodiments.

The protrusion piece 241 having the positioning fitting hole 240A formed therein is provided on the end surface of the base 200A.

The cutout portion 341 is formed in the looped peripheral wall 332A, and the protrusion piece 241 is fitted into and closely opposed to the cutout portion 341. The positioning protrusion 340A is provided in a projecting manner on the cutout portion, and the positioning protrusion is fitted into the positioning fitting hole 240A.

As described above, in relation to claim 4 of the present invention, the protrusion piece having the positioning fitting hole formed therein is provided on the end surface of the base. The protrusion piece is closely opposed to the cutout portion formed in the looped peripheral wall, and the positioning protrusion that is fitted into the positioning fitting hole is provided on the cutout portion in a projecting manner.

Therefore, the present invention has features in that the protrusion piece and the cutout portion abut on each other, to thereby restrict such a situation where the second sealing gap becomes extremely small, and that the relative position between the base and the connector housing is regulated by the positioning protrusion fitted into the positioning fitting hole, to thereby be capable of suppressing fluctuation of the sealing gap.

This holds true for the second and third embodiments.

The first sealing gap is defined between opposing surfaces of the first convex thread 353, which has a triangular cross-section and is formed on the three sides of the outer periphery of the connector housing 330A, and the first concave thread 453, which has a trapezoid cross-section and is formed in the cover 400A.

The second sealing gap is defined between opposing surfaces of the second concave thread 302, which has a trapezoid cross-section and is formed on the one remaining side of the outer periphery of the connector housing 330A serving as the bottom surface thereof, and the second convex thread 202, which has a trapezoid cross-section and is formed on the base 200A.

The bottom of the first convex thread 353 extends beyond the inner boundary surface 335 of the partition wall 333 so as to have a wide dimension so that both inclined surfaces of the convex thread each have a gentle inclination. The slant portions forming the second convex thread 202 each have an angle of inclination equal to or gentler than an angle of inclination of the first convex thread 353.

As described above, in relation to claim 5 of the present invention, the first concave thread formed in the cover and the second convex thread formed on the base each have gentle slant portions so as to have a wide dimension, and thus can be processed with a simple die.

Therefore, the present invention has a feature in that the cover and the base can be formed of products formed by sheet metal working. Whether a product formed by resin forming or aluminum die casting is used for the cover or the base is determined depending on a method of forming the third sealing gap, and hence the present invention has a feature in that the same die for manufacturing the connector housing can be used irrespective of the configuration of the third sealing gap.

Irrespective of differences in structure from the first sealing gap and the second sealing gap, the third sealing gap is selected as appropriate from any one of opposing surfaces of the third convex thread 203, the undulating deformation portion 223, or the slope portion 203b, which is formed on three sides of a periphery of the base 200A, and the third concave thread 403, the undulating deformation portion 423, or the slope portion 403b, which is formed on three sides of a periphery of the cover 400A.

Among the opposing surfaces, the third convex thread 203 and the third concave thread 403 have a larger fitting depth than a fitting width dimension, and define the third sealing gap having a narrow width dimension suitable for resin forming or die casting.

As described above, in relation to claim 8 of the present invention, depending on a size of an allowable sealing width dimension, the third sealing gap can be selected as appropriate from the sealing surfaces of the step-slope system, the sealing surfaces of the undulating deformation portion system, and the sealing surfaces of a convexoconcave sealing surface system.

Therefore, the present invention has the following features. When the convexoconcave sealing surface system is selected, using the base formed by metal die casting, the third sealing gap can be suited for downsizing and high-temperature dissipation. In addition, the same die for manufacturing the connector housing can be used irrespective of the configuration of the third sealing gap.

The present invention provides a method of assembling the waterproof control unit according to the first embodiment, in which the central flat surface 453b sandwiched between the outer inclined surface 453a and the inner inclined surface 453c is formed on the inner surface of the cover 400A forming one of gap surfaces of the first sealing gap, and the enlarged gap dimension GP between the central flat surface 453b and the connector housing 330A is set to be larger than the first orthogonal gap G1 at the flat surface situated on the outer side of the outer inclined surface 453a, and than the first orthogonal gap G1 at the flat surface situated on the inner side of the inner inclined surface 453c, the method including:

the first processing step 902 of mounting the cover 400A onto a jig under a reversed state, and applying, into a non-looped shape, the pasty waterproof sealing material 501 to the central flat surface 453b of the cover 400A;

the second processing step 903c of mounting, onto stepped portions provided on three sides of the outer periphery of the cover 400A, the circuit board 300A having the circuit components 311 and the connector housing 330A mounted and soldered thereonto in advance, to thereby join the connector housing 330A and the cover 400A;

the third processing step 904 of applying, into a looped shape, the pasty waterproof sealing material 503 to a sealing surface defining the third sealing gap of the cover 400A that has been subjected to the second processing step 903c, and the pasty waterproof sealing material 502 to a sealing surface defining the second sealing gap of the connector housing 330A; and the fourth processing step 905b of mounting the base 200A onto the cover 400A that has been subjected to the third processing step 904, integrating and fixing the cover 400A and the base 200A, and sandwiching and fixing the circuit board 300A by three sides of an outer periphery of the base 200A and the three sides of the outer periphery of the cover 400A, the method further including drying and curing, after finishing the fourth processing step 905b, the pasty waterproof sealing materials 501, 502, and 503 by standing at room temperature or heating while carrying out visual inspection and performance inspection.

The following method is employed for the waterproof control unit including, as the circuit components 311, the first heat generating component 311a mounted on a surface of the circuit board 300A, which is opposed to the cover 400A, or the second heat generating component 311b mounted on a surface of the circuit board 300A, which is opposed to the base 200A, and including, on the base 200A, the first heat transfer base portion 361a adjacent to a back surface of the first heat generating component 311a or the second heat transfer base portion 361b adjacent to the second heat generating component 311b.

The second processing step 903c includes the additional processing step of applying the pasty heat conductive adhesive 511a or 511b to a surface of the circuit board 300A, which corresponds to the first or second heat transfer base portion 361a or 361b.

In the additional processing step, applying work is performed under a state in which the circuit board 300A is covered with the transparent jig plate having the window holes through which the heat conductive adhesives 511a and 511b are applied.

As described above, in relation to claim 10 of the present invention, the second processing step of assembling the circuit board having the circuit components and the connector housing mounted thereon includes the additional processing step of applying a heat conductive material to the heat generating components.

Therefore, the present invention has a feature in that a process of drying the waterproof sealing materials and a process of drying the applied heat conductive material can be conducted in the same step.

Further, the present invention has a feature in that whether or not the gap dimension between the heat transfer base portion of the base and the surface of the circuit board having the applied heat conductive material is proper can be visually determined at a point in time when the circuit board is covered with the transparent jig plate.

This holds true for the second and third embodiments.

Second Embodiment (1) Detailed Description of Configuration

Figure 12:
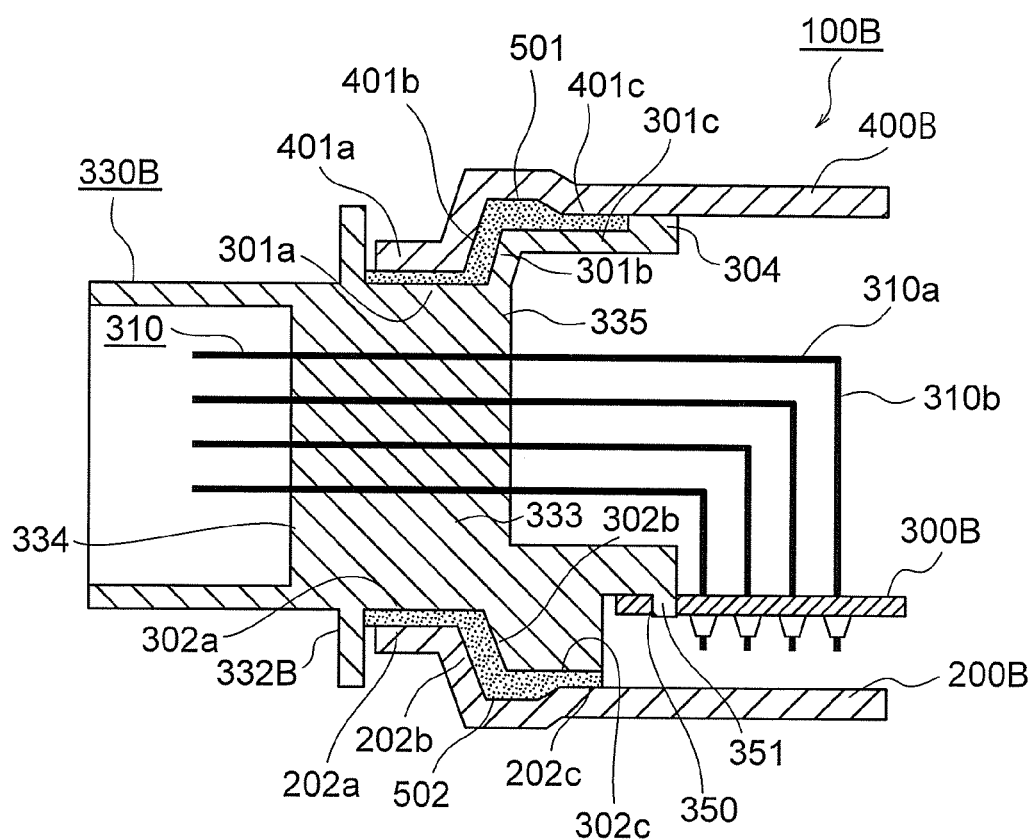
FIG. 12 is a detailed sectional view illustrating a connector housing of FIG. 10.
Figure 13A:
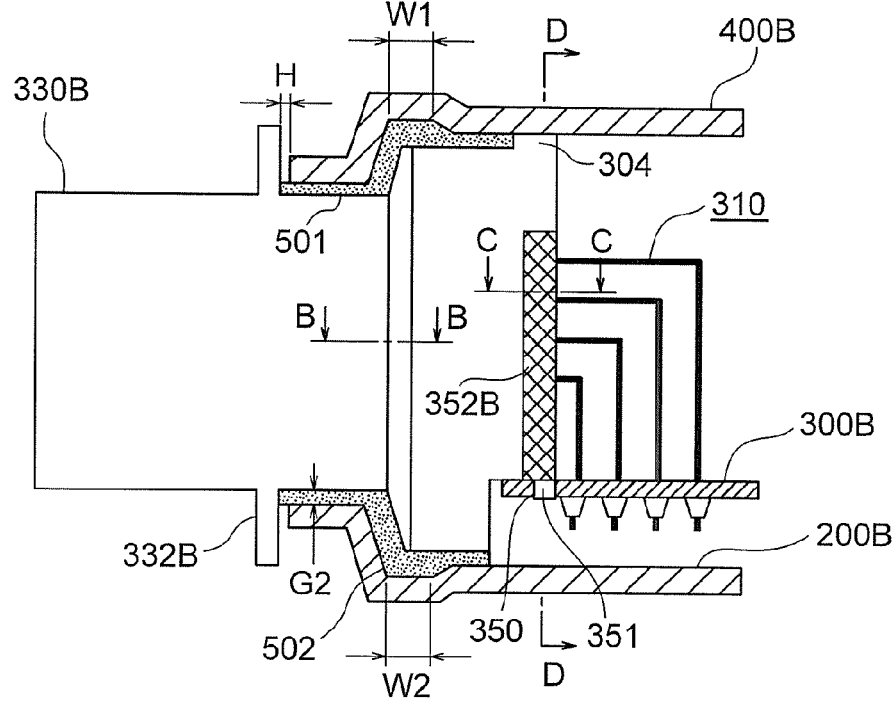
FIG. 13A is a further detailed sectional view illustrating the connector housing of FIG. 12.
Figure 13B:
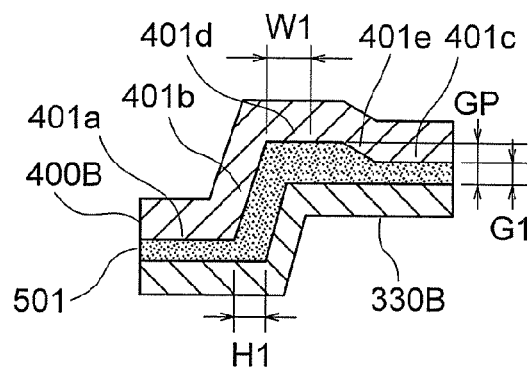
FIG. 13B is a sectional view illustrating the connector housing taken along the line B-B of FIG. 13A.
Figure 13C:
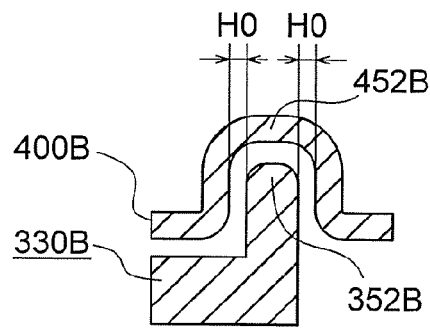
FIG. 13C is a sectional view illustrating the connector housing taken along the line C-C of FIG. 13A.
Figure 14:
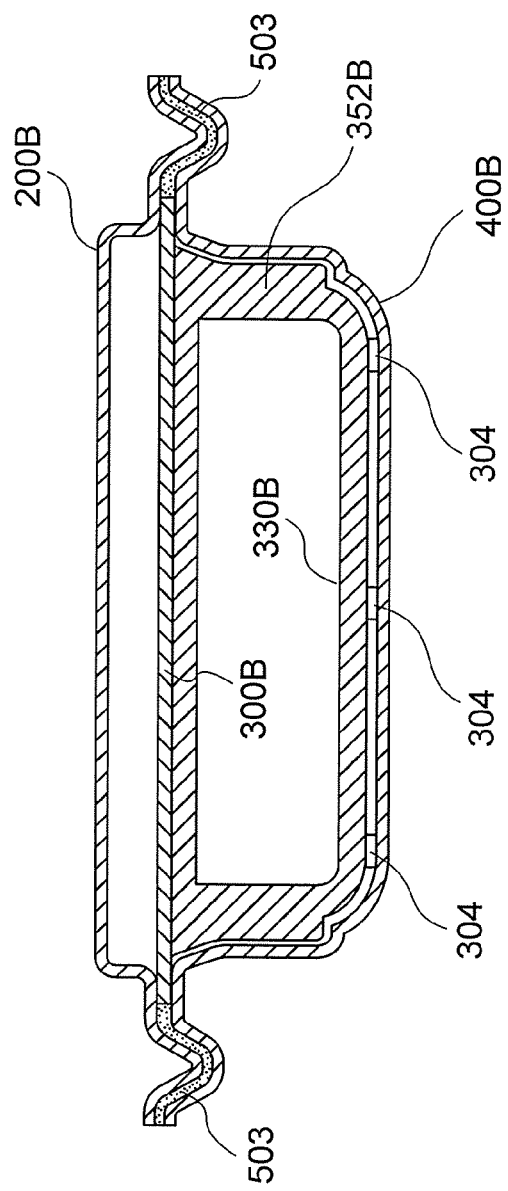
FIG. 14 is a sectional view illustrating the inverted connector housing taken along the line D-D of FIG. 13A.

Now, referring to FIG. 10, which is a plan view illustrating a waterproof control unit according to a second embodiment of the present invention, FIG. 11, which is a partially side sectional view illustrating the waterproof control unit of FIG. 10, FIG. 12, which is a detailed sectional view illustrating a connector housing of FIG. 10, FIGS. 13A to 13C, which are further detailed sectional views illustrating the connector housing of FIG. 12, and FIG. 14, which is a sectional view illustrating the inverted connector housing taken along the line D-D of FIG. 13A, detailed descriptions are mainly made of differences from the waterproof control unit illustrated in FIGS. 1 to 5.

Note that, in the drawings, the same or corresponding parts are represented by the same reference symbols.

In FIG. 10, a waterproof control unit 100B includes a base 200B, a circuit board 3003, and a cover 400B. The base 200B includes right and left mounting legs 211B and 211B, and is made of a sheet metal material. The circuit components 311 and the heat generating components 311a and 311b described later are mounted on the circuit board 300B. The cover 400B includes a flange on three outer peripheral wall portions, and is made of a sheet metal material. An opening portion closed by a connector housing 330B is formed in a part of the remaining one outer peripheral wall portion of the cover 400B.

The circuit board 300B is sandwiched between the cover 400B and the base 200B, and the cover 400B and the base 200B are integrated by folding and caulking folding pieces 413 provided at four corners of the cover 400B.

The connector housing 330B is mounted on one side of the circuit board 300B. A looped peripheral wall 332B described later with reference to FIGS. 12 and 13A is provided in a projecting manner on an outer periphery of the connector housing 330B.

In FIG. 11, on opposing surfaces extending along respective three sides of outer peripheries of the cover 400B and the base 200B, an undulating deformation portion 423, which is provided onto the cover 400B side and has a concave-shaped cross section, and an undulating deformation portion 223, which is provided onto the base 200B side and has a convex-shaped cross section, engage with each other to define the third sealing gap, to thereby form the convexoconcave sealing surfaces having the waterproof sealing material 503 applied therebetween.

As described above, the cover 4003 and the base 200B are caulked and fixed with the folding pieces 413 provided at the four corners of the cover 400B.

At this time, the cover 400B abuts on other at the gap-setting abutment surface 204 of the base 200B, to thereby determine the gap dimension of the third sealing gap to which the waterproof sealing material 503 is to be applied.

The circuit board 300B includes the first heat generating component 311a mounted on a board surface on the cover 400B side, and the second heat generating component 311b mounted on a board surface on the base 200B side. The base 200B includes the first heat transfer base portion 361a adjacent to the bottom surface of the first heat generating component 311a, and the second heat transfer base portion 361b adjacent to the back surface of the second heat generating component 311b. The heat conductive adhesives 511a and 511b are applied to the surfaces of the first and second heat transfer base portions 361a and 361b, respectively.

Note that, in the above description, the circuit board 300B is sandwiched between the cover 400B and the base 200B, but may be fastened and fixed, with a plurality of fixing screws, to a plurality of fixing base portions (not shown) provided onto an inner surface of the base 200B.

Further, instead of sandwiching the circuit board 300B between the respective three sides of the outer peripheries of the cover 400B and the base 200B, the circuit board 300B may be fastened and fixed to the cover 400B and the base 200B with fixing screws (not shown).

In FIG. 12, the connector housing 330B includes the looped peripheral wall 332B described above with reference to FIG. 10, and the partition wall 333 to which the contact terminals 310 of the right-angle type are press-fitted.

A mating connector (not shown) is inserted at a position on an outer side of the outer boundary surface 334 of the partition wall 333, and mating contact terminals are inserted to establish contact connection to the ends of the contact terminals 310 on one side.

The horizontal portions 310a and the perpendicular portions 310b of the contact terminals 310 are arranged on an inner side of the inner boundary surface 335 of the partition wall 333 under a state in which the horizontal portions 310a and the perpendicular portions 310b are exposed in a space. The distal ends of the perpendicular portions 310b pass through the front and back surfaces of the circuit board 300B, and are connected on the back surface side by soldering.

Note that, when the perpendicular portions 310b of the contact terminals 310 are expanded and contracted due to a change in ambient temperature, the horizontal portions 310a are curved so as to prevent breakage of the solder-connection portion between the perpendicular portions 310b and the circuit board 300B. When the horizontal portions 310a of the contact terminals 310 are expanded and contracted due to a change in ambient temperature, the perpendicular portions 310b are curved so as to prevent stress from being applied to the press-fitting portion between the horizontal portions 310a and the partition wall 333.

Further, on both sides of a left side of the circuit board 300B, the board engagement portion 350, which is a board hole or a cutout portion, is provided. The positioning protrusion piece 351 such as a snap pin press-fitted to the connector housing 330B is fitted into the board engagement portion 350 so as to regulate a relative mounting position between the connector housing 330B and the circuit board 300B.

At a left opening portion of the cover 400B where a part of the connector housing 330B is exposed, an outer-step flat portion 401a, a slope portion 401b, and an inner-step flat portion 401c are provided and opposed to an outer-step flat portion 301a, a slope portion 301b, and an inner-step flat portion 301c on the connector housing 330B side, respectively, to thereby define the first sealing gap. In the first sealing gap, the waterproof sealing material 501 is applied.

Note that, the waterproof sealing material 501 is applied in a range beyond the inner boundary surface 335 of the partition wall 333. Thus, the angle of inclination of the slope portion 301b is equal to or gentler than the angle of inclination of the first concave thread 353 of FIG. 4B.

Further, at an inner end surface position of the inner-step flat portion 301c of the connector housing 330B, a plurality of gap-setting protrusions 304 are provided in a projecting manner, and abut on an inner surface of the cover 400B, to thereby restrict such a situation where the first sealing gap becomes extremely small.

The gap-setting protrusions 304 may be provided onto the inner surface side of the cover 400B, or may be provided onto the outer-step flat portion 301a of the connector housing 330B or the outer-step flat portion 401a of the cover 400B.

On a left side of the base 200B opposed to the connector housing 330B, an outer-step flat portion 202a, a slope portion 202b, and an inner-step flat portion 202c are provided and opposed to an outer-step flat portion 302a, a slope portion 302b, and an inner-step flat portion 302c on the connector housing 330B side, respectively, to thereby define the second sealing gap. In the second sealing gap, the waterproof sealing material 502 is applied.

Note that, the waterproof sealing material 502 is applied in a range beyond the inner boundary surface 335 of the partition wall 333.

Further, the second sealing gap is regulated in such a way that the cutout portion 341 and the protrusion piece 241, which are described later with reference to FIGS. 16 and 17, abut on each other in an opposing manner.

Note that, the second sealing gap may be regulated by a height of a mounting surface of the circuit board 300B and the base 200B. In this case, the gap-setting protrusions for the second sealing gap may be omitted.

In FIG. 13A and FIG. 13B, which is a sectional view taken along the line B-B of FIG. 13A, regarding the outer-step flat portions 301a and 401a, the slope portions 301b and 401b, and the inner-step flat portions 301c and 401c (see FIG. 12) defining the first sealing gap, as described with reference to FIG. 4B, the first horizontal gap H1 in the horizontal direction (right-and-left direction of FIGS. 13A to 13C) between the slope portions satisfies, for example, a relation of H1≥2×G1 with respect to the first orthogonal gap G1 corresponding to the sealing gap between the outer-step flat portions or between the inner-step flat portions.

Note that, the first sealing gap surface of the cover 400B includes the slope portion 401b serving as an outer inclined surface, a central flat surface 401d, and an inner inclined surface 401e. The outer-step flat portion 401a is formed on an outer side of the outer inclined surface (slope portion) 401b, and an inner side of the inner inclined surface 401e is continuous with the inner-step flat portion 401c.

Further, the enlarged gap dimension GP having a value larger than that of the first orthogonal gap G1 is adopted in a band of a gap widening region W1 of the central flat surface 401d of the cover 400B. Similarly to the first horizontal gap H1, the enlarged gap dimension GP satisfies a relation of GP≥2×G1.

A detailed dimension of the second sealing gap is also set similarly to the case of the first sealing gap.

Regarding the outer-step flat portions 302a and 202a, the slope portions 302b and 202b, and the inner-step flat portions 302c and 202c (see FIG. 12) defining the second sealing gap, a second horizontal gap H2 (not shown) in the horizontal direction (right-and-left direction of FIGS. 13A to 13C) between the slope portions satisfies, for example, a relation of H2≥2×G2 with respect to the second orthogonal gap G2 corresponding to the sealing gap between the outer-step flat portions or between the inner-step flat portions.

Further, a central flat surface and an inner inclined surface are formed at a coupling portion between the inner-step flat portion 202c and the slope portion 202b of the base 200B (see FIG. 12). The enlarged gap dimension GP is adopted in a band of a gap widening region W2, and satisfies a relation of GP≥2×G2 similarly to the second horizontal gap H2 (not shown).

In FIG. 13C, which is a partially sectional view taken along the line C-C of FIG. 13A, a side-surface convex thread 352B is formed on each oblique side portion of the trapezoid of the connector housing 330B (see FIG. 14) having an exposed end surface of a trapezoid shape, and a side-surface concave thread 452B into which the side-surface convex thread 352B is fitted is formed in the cover 400B.

As described above with reference to FIGS. 4A to 4C, the movement margin dimension H0, which is a right or left gap dimension between the side-surface convex thread 352B and the side-surface concave thread 452B is designed to have the smallest value among those of the first horizontal gap H1 and the second horizontal gap H2.

Therefore, even when there are dimension fluctuations of the respective portions and dimension errors of assembly, the movement margin dimension H0 strictly restricts a relative position between the connector housing 330B and the cover 400B, and thus prevents occurrence of such a situation where dimension fluctuations of the right and left first horizontal gaps H1 become extremely large so that one of the horizontal gaps becomes zero to cause abutment of the inclined surfaces.

FIG. 14, which is obtained by inverting a partially sectional view taken along the line D-D of FIG. 13A, illustrates the following state. Specifically, as described later with reference to FIGS. 15 to 17, after the waterproof sealing material 501 is applied to a first sealing gap surface of the cover 400B that is reversed (FIG. 15), an intermediate assembly body formed of the connector housing 330B and the circuit board 300B is inserted into the cover 400B. Subsequently, the waterproof sealing material 502 and the waterproof sealing material 503 are applied into a looped shape to a second sealing gap surface of the connector housing 330B and a third sealing gap surface of the cover 400B, respectively (FIG. 16), and then the base 200B is mounted. Then, the folding pieces 413 are folded so as to clutch and fix the four corners of the cover 400B (FIG. 17).

Note that, in the above description, the third sealing gap defined between directly-opposing surfaces of the cover 400B and the base 200B is defined between the undulating deformation portion 223 having a convex thread form and the undulating deformation portion 423 having a concave thread form illustrated in FIG. 11. Instead of this, there may be adopted the third convex thread 203 and the third concave thread 403, which are described above with reference to FIG. 2. Alternatively, the third sealing gap may be defined between the slope portion 203b and the slope portion 403b, which are described later with reference to FIG. 19.

(2) Description of Assembling Method

Next, a method of assembling the waterproof control unit 100B configured as illustrated in FIGS. 10 to 14 is described in detail with reference to FIG. 9 illustrating a flow chart of assembly described above and FIGS. 15 to 17 illustrating states of intermediate steps of assembly.

Figure 15:
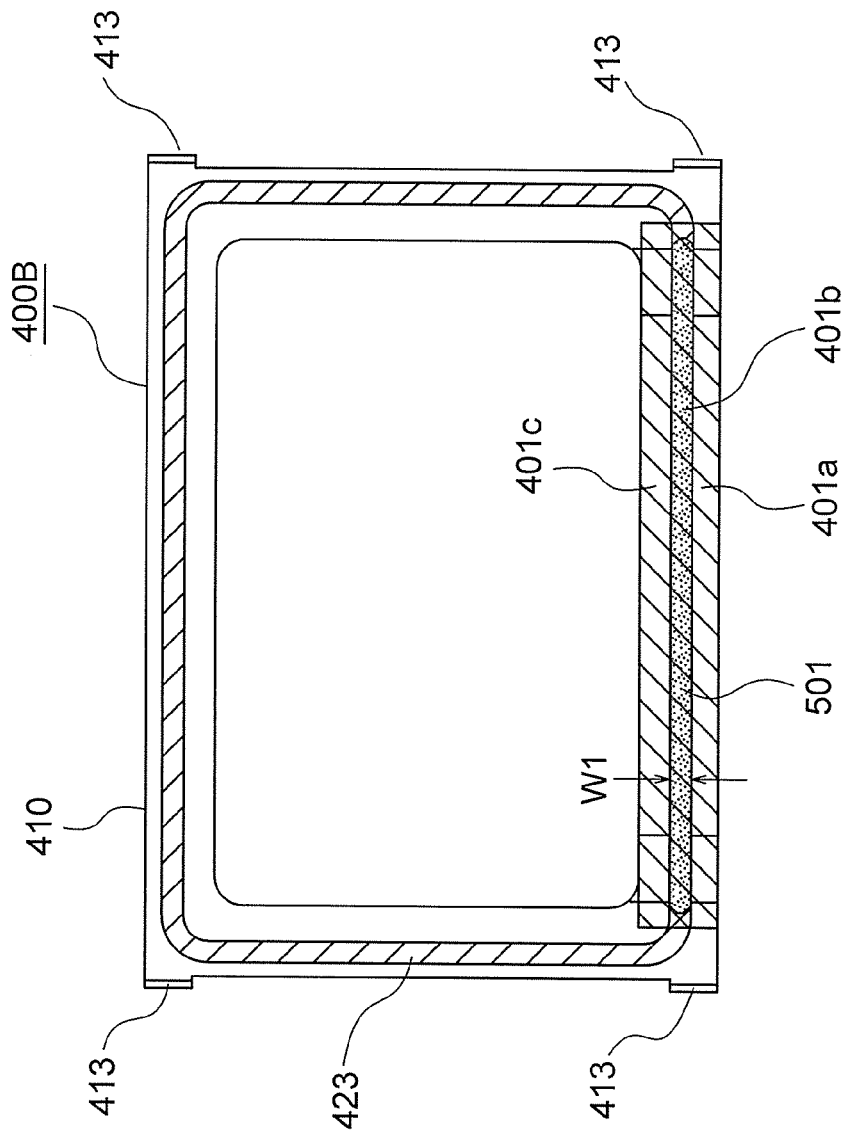
FIG. 15 is a view illustrating an inner surface of a cover of FIG. 10.

In FIG. 15, which is a view illustrating an inner surface of the cover 400B, the outer-step flat portion 401a, the slope portion 401b, and the inner-step flat portion 401c illustrated in FIGS. 12 and 13A to 13C are formed in an opening end (on a lower side of FIG. 15) of the cover 400B. The pasty waterproof sealing material 501 is applied to the band of the gap widening region W1 (see FIG. 13B) of the slope portion 401b.

Note that, the opening end of the cover 400B is formed into a trapezoid shape. FIG. 15 illustrates by the straight lines such a solid shape that a short top surface of the trapezoid is recessed in a direction of a back of the drawing sheet, and right and left inclined surfaces extending from the short top surface reach a front of the drawing sheet.

The third sealing gap surface formed of the undulating deformation portion 423 illustrated in FIG. 11 is formed on the three sides of the outer periphery of the cover 400B. In FIG. 15, the waterproof sealing material 503 is not applied to the third sealing gap surface yet.

Figure 16:
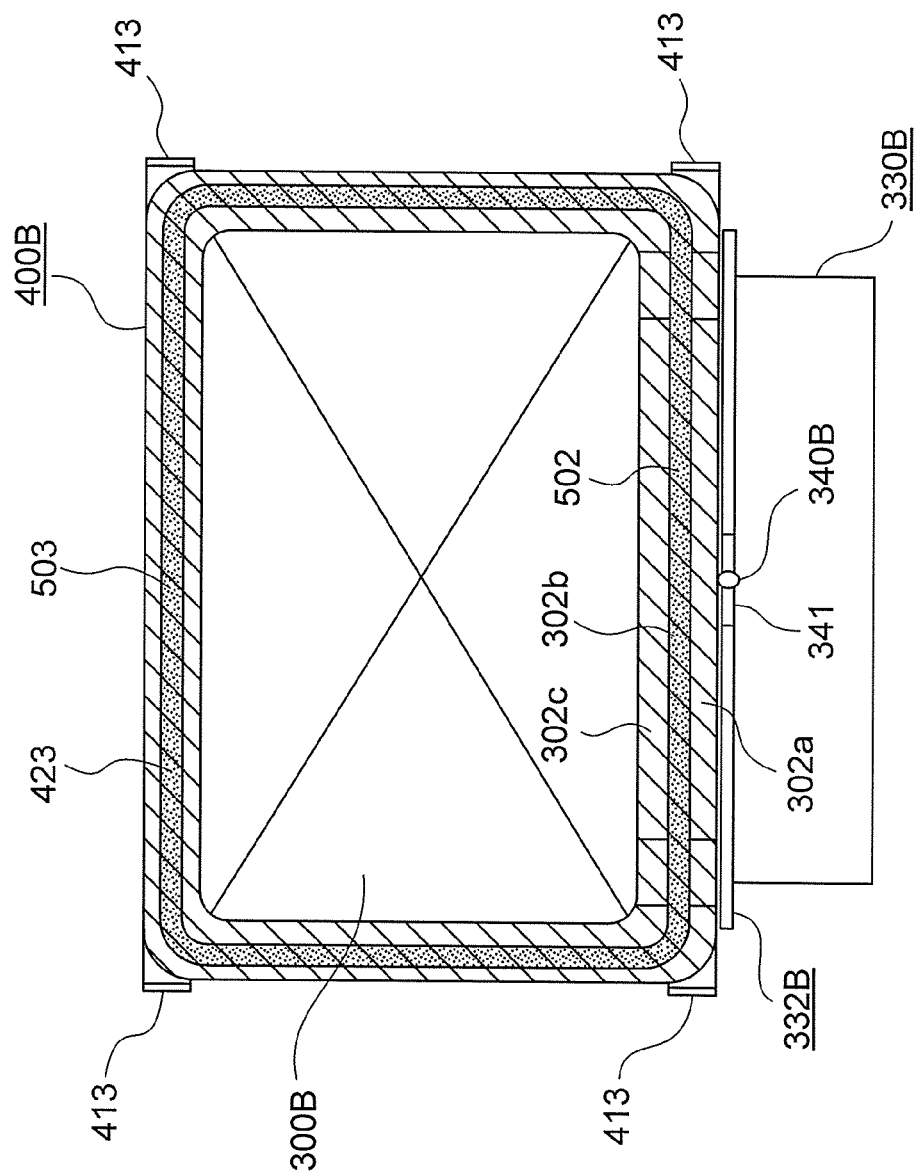
FIG. 16 is a plan view illustrating combination of the cover and a circuit board of FIG. 10.

In FIG. 16 illustrating a state in which the circuit board 300B is mounted to the cover 400B, the circuit components 311, the first and second heat generating components 311a and 311b (see FIG. 11), and the connector housing 330B are mounted and assembled to the circuit board 300B. The connector housing 330B is mounted on a back surface side of the circuit board 300B illustrated in FIG. 16.

Note that, the cutout portion 341 is formed in the looped peripheral wall 332B of the connector housing 330B, and a positioning protrusion 340B is provided on the cutout portion 341 in a projecting manner.

The pasty waterproof sealing materials 502 and 503 are adhesively applied into a looped shape to the slope portion 302b of the connector housing 330B and the undulating deformation portion 423 of the cover 400B, respectively.

Note that, the waterproof sealing material 502 may be adhesively applied to the inner-step flat portion 302c side around the slope portion 302b.

In this case, when the base 200B is placed, with an aid of the gap widening region W2 (see FIG. 13A), the waterproof sealing material 502 is fed and distributed under pressure to the slope portions 302b and 202b and the outer-step flat portions 302a and 202a.

Figure 17:
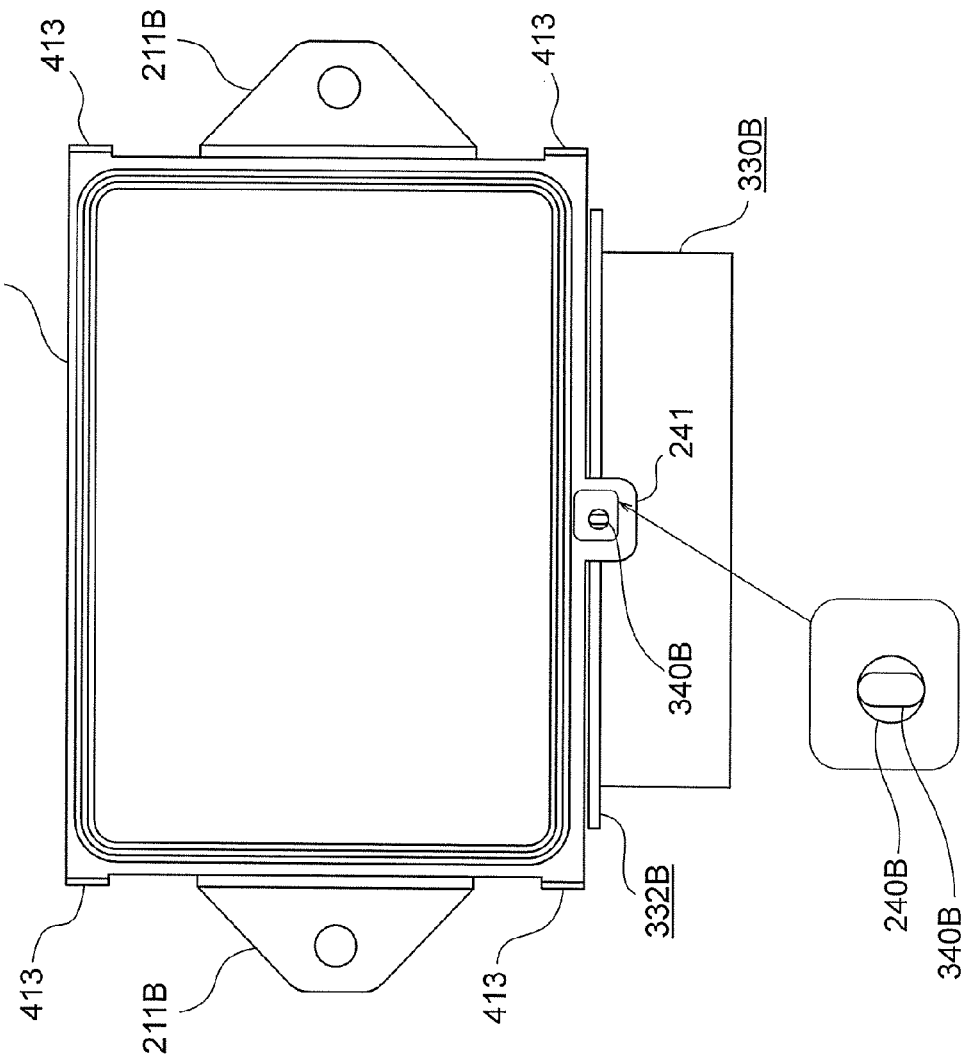
FIG. 17 is a plan view illustrating combination of the cover, the circuit board, and a base of FIG. 10.

In FIG. 17, which is a back view illustrating a state in which the cover 400B, the circuit board 300B, and the base 200E are integrated together, the protrusion piece 241 is formed on the base 200B. The protrusion piece 241 is fitted into the cutout portion 341 (see FIG. 16) of the connector housing 330B, and the positioning protrusion 340B of the connector housing 330B is fitted into a positioning fitting hole 240B formed in the protrusion piece 241.

Note that, the positioning protrusion 340B has an elliptic shape. When the positioning protrusion 340B is fitted into the positioning fitting hole 240B, even when fitting is performed slightly forcibly, distal end portions of a major axis of the ellipse are trimmed so that the positioning protrusion 340B can be fitted into the positioning fitting hole 240B.

As a result, a relative position between the base 200B and the connector housing 330B is determined by a fitting state of the positioning fitting hole 240B and the positioning protrusion 340B serving as plane movement regulating members. The respective inclined surfaces of the pair of the slope portion 202b and the slope portion 302b illustrated in FIG. 12 are not held in contact with each other, and thus the waterproof sealing material 502 is filled laterally evenly.

Next, a method of assembling the waterproof control unit according to the second embodiment of the present invention is described with reference to FIG. 9 by focusing on differences from the first embodiment.

In the second embodiment, steps from the start step 900 for assembly work to the second processing step 903c, and the preparation steps 903a, 903b, and 905a in FIG. 9 are performed similarly to the case of the first embodiment. However, a state of the cover 400B in the first processing step 902 is illustrated in FIG. 15.

As described with reference to FIG. 16, in the third processing step 904, the pasty waterproof sealing materials 502 and 503 are applied into a looped shape to the second sealing gap surface of the connector housing 330B and the third sealing gap surface of the cover 400B, respectively.

Step 905b subsequent to Step 904 is a fourth processing step of, similarly to the first embodiment, mounting, onto the cover 400B under a reversed state, the base 200B having the ventilation filter bonded and fixed thereto in the preparation step 905a, joining, to the mating surfaces, the heat conductive adhesives 511a and 511b applied in Step 903c and the waterproof sealing materials 502 and 503 applied in Step 904, and folding the folding pieces 413 of the cover 400B to integrate and fix the base 200B members or screws (see FIGS. 14 and 17).

Subsequent Step 906 is a step of, similarly to the first embodiment, carrying out initial setting, performance inspection, and visual inspection of the waterproof control unit 100B, while drying, at room temperature or under a heated condition, the heat conductive adhesives 511a and 511b and the waterproof sealing materials 501, 502, and 503 applied in Step 903c and Step 904. Thus, the processing proceeds to a general assembly completion step 907.

Note that, as the visual inspection, it is determined whether or not the cover 400B, the connector housing 330B, and the base 200B have a proper relative positional relationship and whether or not degrees of filling of the waterproof sealing materials 501 and 502 are proper by inspecting overflow degrees of the waterproof sealing materials 501 and 502 in the opening gaps H (see FIG. 13A) defined between the looped peripheral wall 332B of the connector housing 330B and an end surface of the cover 400B and between the looped peripheral wall 332B and an end surface of the base 200B, and by carrying out visual determination or automatic determination using image recognition through comparison with a standard sample.

(3) Main Points and Features of Second Embodiment

As is apparent from the above description, in the waterproof control unit 100B according to the second embodiment of the present invention, the connector housing 330B through which the plurality of contact terminals 310 pass via the partition wall 333 is positioned and fixed to the circuit board 300B, which is hermetically housed in the casing including the base 200B and the cover 400B and has the circuit components 311 mounted thereon. The waterproof control unit 100B includes the waterproof sealing materials 501, 502, and 503 filled into the first sealing gap defined between opposing surfaces of the connector housing 330B and the cover 400B, the second sealing gap defined between opposing surfaces of the connector housing 330B and the base 200B, and the third sealing gap defined between directly-opposing surfaces of the base 200B and the cover 400B, so as to expose, from the opening portion of the side surface of the cover 400B, an external-connection end surface of the connector housing.

The connector housing 330B is made of a resin forming material, and a first opposing surface, which includes a flat surface and an inclined surface forming one of the opposing surfaces of the first sealing gap, is formed on three sides of the outer periphery of the connector housing 330B.

A second opposing surface, which includes a flat surface and an inclined surface forming one of the opposing surfaces of the second sealing gap, is formed on one remaining side of the outer periphery of the connector housing 330B serving as a bottom surface thereof.

The inclined surface of the first opposing surface includes the slope portion 301b connecting the outer-step flat portion 301a and the inner-step flat portion 301c in a stepped manner, and the inclined surface of the second opposing surface includes the slope portion 302b connecting the outer-step flat portion 302a and the inner-step flat portion 302c in a stepped manner.

The first opposing surface and the second opposing surface extend across the inner boundary surface 335 of the partition wall 333 toward an inside and an outside of the casing.

The connector housing 330B further includes the looped peripheral wall 332B formed at a position of the outer periphery of the connector housing 330B exposed from the casing, and the pair of side-surface convex threads 352B formed on both side surfaces at a position of an unexposed end surface of the connector housing 330B.

The looped peripheral wall 332B is opposed to an opening side surface of the cover 400B and an end surface of the base 200B with the opening gap H.

The side-surface convex threads 352B function as the plane movement regulating members that are fitted into the pair of side-surface concave threads 452B formed in the cover 400B, and a relative position between the connector housing 330B and the cover 400B is regulated by the plane movement regulating members so that a plane movement gap dimension of the first sealing gap is kept within a predetermined range of fluctuation.

Therefore, the waterproof control unit 100B according to the second embodiment includes the cover 400B and the base 200B made of inexpensive sheet metal that is produced in a shorter processing time period than a forming material, and the configuration according to the second embodiment is suitable for the waterproof control unit 100B having a modest heat dissipating property to the base 200B and having a room for a peripheral mounting space.

The connector housing 330B includes the partition wall 333, into which the plurality of contact terminals 310 of a right-angle type are press-fitted. The end surface of the connector housing has a trapezoid shape. A long base of the trapezoid is positioned by the positioning protrusion piece 351 and the board engagement portion 350, and is fixed to one side of the circuit board 300B, and a portion of the connector housing projecting beyond the one side of the circuit board 300B is opposed to the base 200B via the second sealing gap. A short top side and right and left oblique sides of the trapezoid are opposed to the opening portion of the side surface of the cover 400B via the first sealing gap.

At least a part of the inner-step flat portion 301c continuous with the slope portion 301b defining the first sealing gap extends beyond the inner boundary surface 335 of the partition wall 333 toward the inside of the casing.

At least a part of the inner-step flat portion 302c continuous with the slope portion 302b defining the second sealing gap extends beyond the inner boundary surface 335 of the partition wall 333 toward the inside of the casing.

As described above, in relation to claim 2 of the present invention, the plurality of contact terminals of a right-angle type are press-fitted and fixed into the partition wall of the connector housing. The end surface of the connector housing has a trapezoid shape. The first sealing gap between the connector housing and the cover and the second sealing gap between the connector housing and the base extend toward the inside of the casing beyond the inner boundary surface of the partition wall.

Therefore, similarly to the first embodiment, the present invention has the following features. The first and second sealing gaps are elongated using an idle space formed around the extending inner horizontal portions of the contact terminals, and thus it is possible to ensure a sealing surface distance even when the slant portions defining the sealing gap have gentle inclinations. Thus, sealing surfaces can be formed with simple die structure.

Further, the present invention has the following features. The connector housing has a trapezoid shape, and hence an idle space is formed at the oblique side portion on a long base side. Thus, it is easy to arrange the side-surface convex thread and the side-surface concave thread serving as the plane movement regulating members, and it is easy to apply the waterproof sealing material in the first sealing gap formed in the opening portion of the side surface of the cover.

The first sealing gap is defined between opposing surfaces of the slope portion 301b formed on the three sides of the outer periphery of the connector housing 330B and a slope portion 401b formed in the cover 400B, and each of the slope portions 301b and 401b is elongated to the inner-step flat portion 301c or 401c and the outer-step flat portion 301a or 401a.

The second sealing gap is defined between opposing surfaces of the slope portion 302b formed on the one remaining side of the outer periphery of the connector housing 330B serving as the bottom surface thereof and a slope portion 202b formed in the base 200B, and each of the slope portions 302b and 202b is elongated to the inner-step flat portion 302c or 202c and the outer-step flat portion 302a or 202a.

As described above, in relation to claim 6 of the present invention, the first sealing gap and the second sealing gap are each defined between step-slope surfaces having the gentle slant portions, and can be processed with a simple die.

Therefore, the present invention has a feature in that the cover and the base can be formed of products formed by sheet metal working. Whether a product formed by resin forming or aluminum die casting is used for the cover or the base is determined depending on a method of forming the third sealing gap, and hence the present invention has a feature in that the same die for manufacturing the connector housing can be used irrespective of the configuration of the third sealing gap.

Irrespective of differences in structure from the first sealing gap and the second sealing gap, the third sealing gap is selected as appropriate from any one of opposing surfaces of the third convex thread 203, the undulating deformation portion 223, or the slope portion 203b, which is formed on the three sides of the periphery of the base 200B, and the third concave thread 403, the undulating deformation portion 423, or the slope portion 403b, which is formed on the three sides of the periphery of the cover 400B.

Among the opposing surfaces, the undulating deformation portions 223 and 423 have a smaller fitting depth than a mutual fitting width dimension, and thus define the third sealing gap having an intermediate width dimension suitable for sheet metal working.

As described above, in relation to claim 8 of the present invention, depending on a size of an allowable sealing width dimension, the third sealing gap can be selected as appropriate from the sealing surfaces of the step-slope system, the sealing surfaces of the undulating deformation portion system, and the sealing surfaces of the convexoconcave sealing surface system.

Therefore, the present invention has the following features. When the undulating deformation portion system is selected, both the cover and the base can be formed of inexpensive products formed by sheet metal working. In a case where a heat dissipating property is required, a base formed by die casting can be used. In addition, the same die for manufacturing the connector housing can be used irrespective of the configuration of the third sealing gap.

The present invention provides a method of assembling the waterproof control unit according to the second embodiment, in which the central flat surface 401d sandwiched between the outer inclined surface 401b and the inner inclined surface 401e is formed on the inner surface of the cover 400B forming one of gap surfaces of the first sealing gap, and the enlarged gap dimension GP between the central flat surface 401d and the connector housing 330B is set to be larger than the first orthogonal gap G1 at the flat surface situated on the outer side of the outer inclined surface 401b, and than the first orthogonal gap G1 at the flat surface situated on the inner side of the inner inclined surface 401e, the method including:

the first processing step 902 of mounting the cover 400B onto a jig under a reversed state, and applying, into a non-looped shape, the pasty waterproof sealing material 501 to the central flat surface 401d of the cover 400B;

the second processing step 903c of mounting, onto stepped portions provided on three sides of the outer periphery of the cover 400B, the circuit board 300B having the circuit components 311 and the connector housing 330B mounted and soldered thereonto in advance, to thereby join the connector housing 330B and the cover 400B;

the third processing step 904 of applying, into a looped shape, the pasty waterproof sealing material 503 to a sealing surface defining the third sealing gap of the cover 400B that has been subjected to the second processing step 903c, and the pasty waterproof sealing material 502 to a sealing surface defining the second sealing gap of the connector housing 330B; and the fourth processing step 905b of mounting the base 200B onto the cover 400B that has been subjected to the third processing step 904, integrating and fixing the cover 400B and the base 200B, and sandwiching and fixing the circuit board 300B by three sides of an outer periphery of the base 200B and the three sides of the outer periphery of the cover 400B, the method further including drying and curing, after finishing the fourth processing step 905b, the pasty waterproof sealing materials 501, 502, and 503 by standing at room temperature or heating while carrying out visual inspection and performance inspection.

Third Embodiment (1) Detailed Description of Configuration

Figure 18:
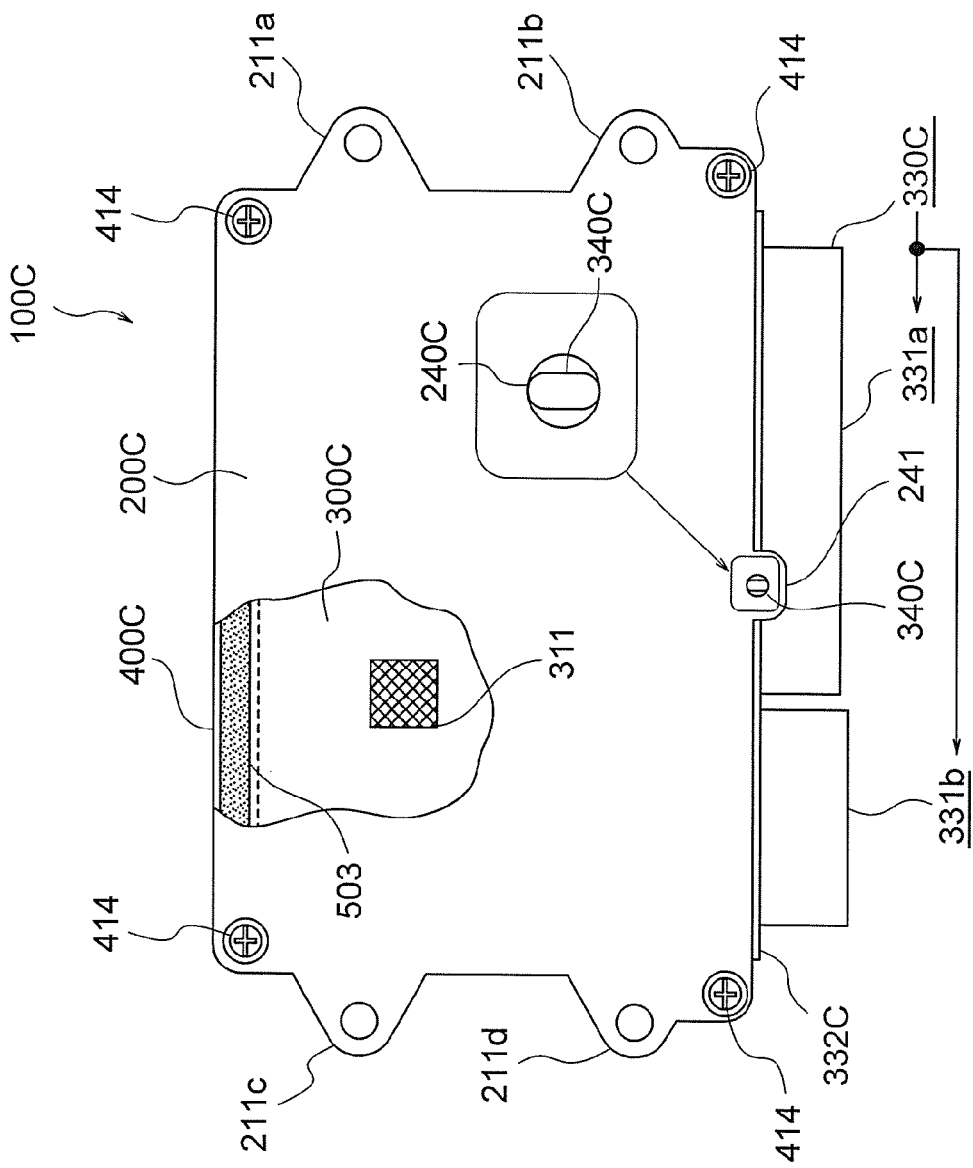
FIG. 18 is an external view illustrating a back surface of a waterproof control unit according to a third embodiment of the present invention.
Figure 19:
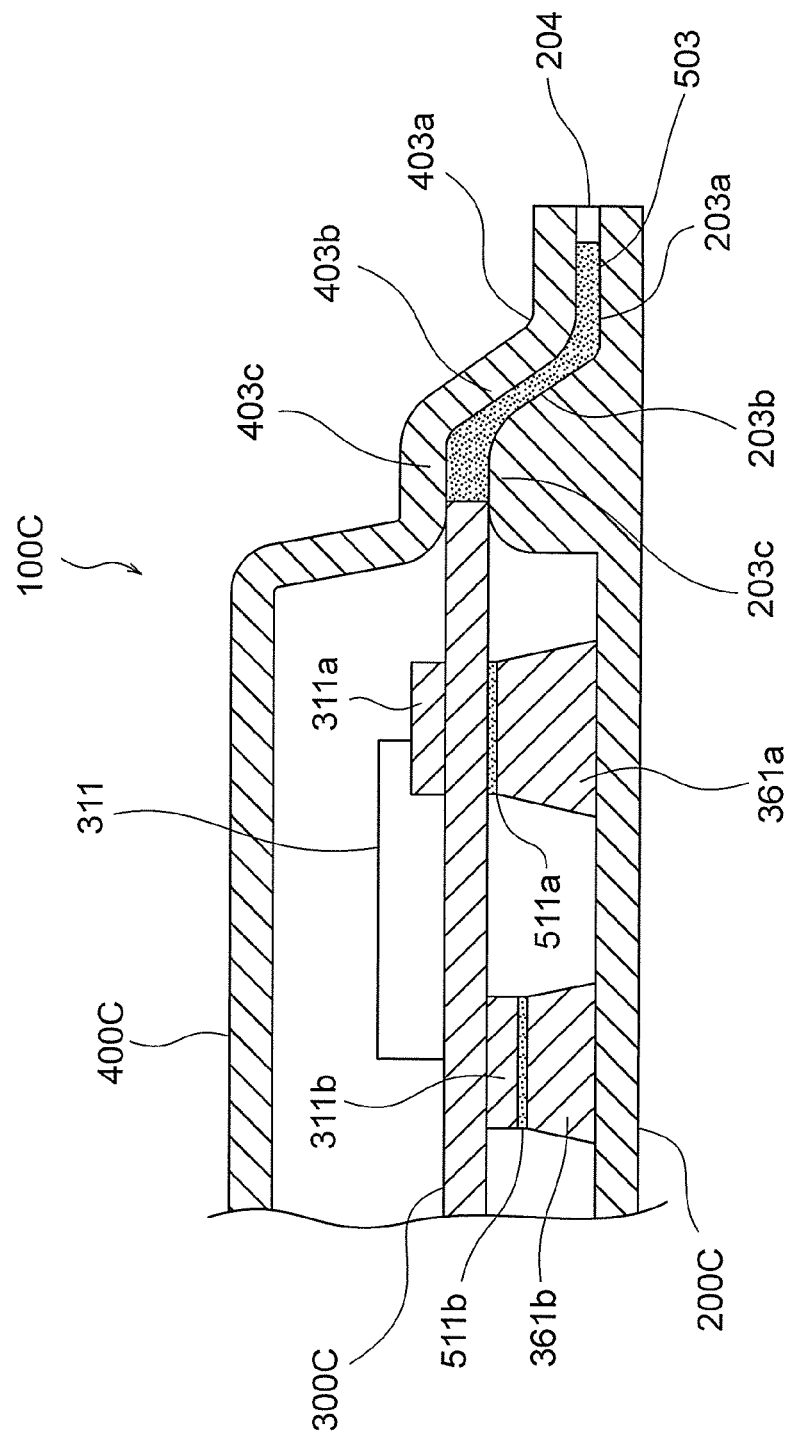
FIG. 19 is a partially side sectional view illustrating the waterproof control unit of FIG. 18.
Figure 20:
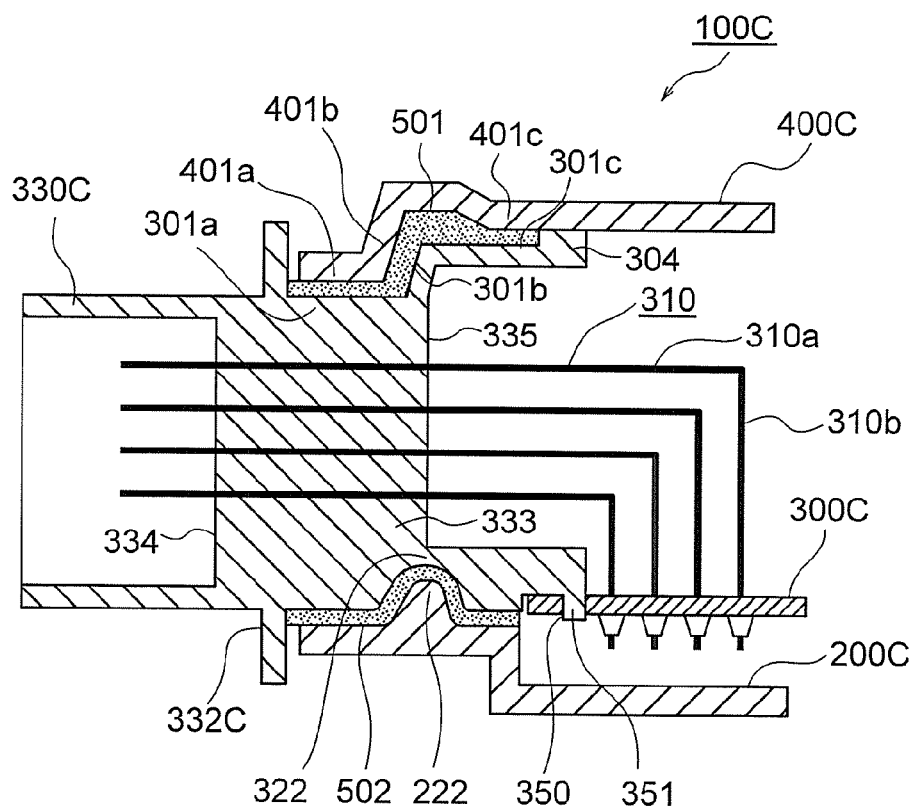
FIG. 20 is a detailed sectional view illustrating a connector housing of FIG. 18.

Now, referring to FIG. 18, which is an external view illustrating a back surface of a waterproof control unit according to a third embodiment of the present invention, FIG. 19, which is a partially side sectional view illustrating the waterproof control unit of FIG. 18, FIG. 20, which is a detailed sectional view illustrating a connector housing of FIG. 18, and FIGS. 21A to 21C, which are further detailed sectional views illustrating the connector housing of FIG. 18, detailed descriptions are mainly made of differences from the waterproof control unit illustrated in FIGS. 1 to 5. Note that, in the drawings, the same or corresponding parts are represented by the same reference symbols.

In FIG. 18, a waterproof control unit 100C includes a base 200C, a circuit board 300C, and a cover 400C. The base 200C includes four mounting legs 211a to 211d, and is formed by aluminum die casting. A plurality of circuit components 311 described later with reference to FIG. 19 and heat generating components 311a and 311b described later are mounted on the circuit board 300C. The cover 400C is made of sheet metal.

The circuit board 300C is hermetically housed in such a manner that the base 200C and the cover 400C are fastened at four corners thereof with coupling screws 414. The remaining one outer peripheral wall portion of the cover 400C is not provided, and an opening portion closed by a connector housing 330C is formed instead.

The connector housing 330C including first and second connector housings 331a and 331b integrally formed is attached to one side of the circuit board 300C. A looped peripheral wall 332C is provided in a projecting manner on outer peripheries of the first and second connector housings 331a and 331b.

Note that, the protrusion piece 241 is formed on the base 200C. The protrusion piece 241 is fitted into the cutout portion 341 formed in the looped peripheral wall 332C, and a positioning protrusion 340C of the connector housing 330C is fitted into a positioning fitting hole 240C formed in the protrusion piece 241.

Further, the positioning protrusion 340C has an elliptic shape. When the positioning protrusion 340C is fitted into the positioning fitting hole 240C, even when fitting is performed slightly forcibly, distal end portions of a major axis of the ellipse are trimmed so that the positioning protrusion 340C can be fitted into the positioning fitting hole 240C.

As a result, a relative position between the base 200C and the connector housing 330C is determined by a fitting state of the positioning fitting hole 240C and the positioning protrusion 340C serving as plane movement regulating members. Respective inclined surfaces of an undulating deformation portion 222 having a convex thread form and an undulating deformation port ion 322 having a concave thread form, which are described later with reference to FIG.

20, are not held in contact with each other, and thus the waterproof sealing material 502 is filled laterally evenly.

In FIG. 19, on opposing surfaces extending along respective three sides of outer peripheries of the cover 400C and the base 200C, an inner-step flat portion 403c, the slope portion 403b, and an outer-step flat portion 403a, which are provided onto the cover 400C side, and an inner-step flat portion 203c, the slope portion 203b, an outer-step flat portion 203a, which are provided onto the base 200C side, are opposed to each other to define the third sealing gap, to thereby form the stepped sealing surfaces having the waterproof sealing material 503 applied therebetween.

As described above with reference to FIG. 18, the cover 400C and the base 200C are fastened together with the four coupling screws 414, and sandwich the circuit board 300C therebetween.

At this time, the cover 400C abuts on the gap-setting abutment surface 204 of the base 200C, to thereby determine the gap dimension of the third sealing gap to which the waterproof sealing material 503 is to be applied.

The circuit board 300C includes the first heat generating component 311a mounted on a board surface on the cover 400C side, and the second heat generating component 311b mounted on a board surface on the base 200C side. The base 200C includes the first heat transfer base portion 361a adjacent to the bottom surface of the first heat generating component 311a through intermediation of the circuit board 300C, and the second heat transfer base portion 361b adjacent to the back surface of the second heat generating component 311b. The heat conductive adhesives 511a and 511b are applied to the surfaces of the first and second heat transfer base portions 361a and 361b, respectively.

Note that, in the above description, the circuit board 300C is sandwiched between the cover 400C and the base 200C, but may be fastened and fixed, with a plurality of fixing screws, to a plurality of fixing base portions (not shown) provided onto an inner surface of the base 200C.

Further, instead of fixing the circuit board 300C with screws between the respective three sides of the outer peripheries of the cover 400C and the base 200C, the circuit board 300C may be caulked and fixed to the cover 400C and the base 200C with folding pieces (not shown).

In FIG. 20, the connector housing 330C includes the looped peripheral wall 332C described above with reference to FIG. 18, and the partition wall 333 to which the contact terminals 310 of the right-angle type are press-fitted.

A mating connector (not shown) is inserted at a position on an outer side of the outer boundary surface 334 of the partition wall 333, and mating contact terminals are inserted to establish contact connection to the ends of the contact terminals 310 on one side.

The horizontal portions 310a and the perpendicular portions 310b of the contact terminals 310 are arranged on an inner side of the inner boundary surface 335 of the partition wall 333 under a state in which the horizontal portions 310a and the perpendicular portions 310b are exposed in a space. The distal ends of the perpendicular portions 310b pass through the front and back surfaces of the circuit board 300C, and are connected on the back surface side by soldering.

Note that, when the perpendicular portions 310b of the contact terminals 310 are expanded and contracted due to a change in ambient temperature, the horizontal portions 310a are curved so as to prevent breakage of the solder-connection portion between the perpendicular portions 310b and the circuit board 300C. When the horizontal portions 310a of the contact terminals 310 are expanded and contracted due to a change in ambient temperature, the perpendicular portions 310b are curved so as to prevent stress from being applied to the press-fitting portion between the horizontal portions 310a and the partition wall 333.

Further, on both sides of a left side of the circuit board 300C, the board engagement portion 350, which is a board hole or a cutout portion, is provided. The positioning protrusion piece 351 such as a snap pin press-fitted to the connector housing 330C is fitted into the board engagement portion 350 so as to regulate a relative mounting position between the connector housing 330C and the circuit board 300C.

At a left opening portion of the cover 400C where a part of the connector housing 330C is exposed, the outer-step flat portion 401a, the slope portion 401b, and the inner-step flat portion 401c are provided and opposed to the outer-step flat portion 301a, the slope portion 301b, and the inner-step flat portion 301c on the connector housing 330C side, respectively, to thereby define the first sealing gap. In the first sealing gap, the waterproof sealing material 501 is applied.

Note that, the waterproof sealing material 501 is applied in a range beyond the inner boundary surface 335 of the partition wall 333.

Further, at an inner end surface position of the inner-step flat portion 301c of the connector housing 330C, a plurality of gap-setting protrusions 304 are provided in a projecting manner, and abut on an inner surface of the cover 400C, to thereby restrict such a situation where the first sealing gap becomes extremely small.

The gap-setting protrusions 304 may be provided onto the inner surface side of the cover 400C, or may be provided onto the outer-step flat portion 301a of the connector housing 330C or the outer-step flat portion 401a of the cover 400C.

On a left side of the base 200C opposed to the connector housing 330C, the undulating deformation portion 222 having a protruded shape is provided, and on the connector housing 330C, the undulating deformation portion 322 having a recessed shape is provided. The undulating deformation portion 222 and the undulating deformation portion 322 are opposed to each other, to thereby define the second sealing gap. In the second sealing gap, the waterproof sealing material 502 is applied.

Note that, the waterproof sealing material 502 is applied in a range beyond the inner boundary surface 335 of the partition wall 333.

Further, the second sealing gap is regulated in such a way that the cutout portion 341 and the protrusion piece 241, which are described above with reference to FIG. 18, abut on each other in an opposing manner.

Note that, the second sealing gap may be regulated by a height of a mounting surface between the circuit board 300C and the base 200C. In this case, the gap-setting protrusions for the second sealing gap may be omitted.

Figure 21A:
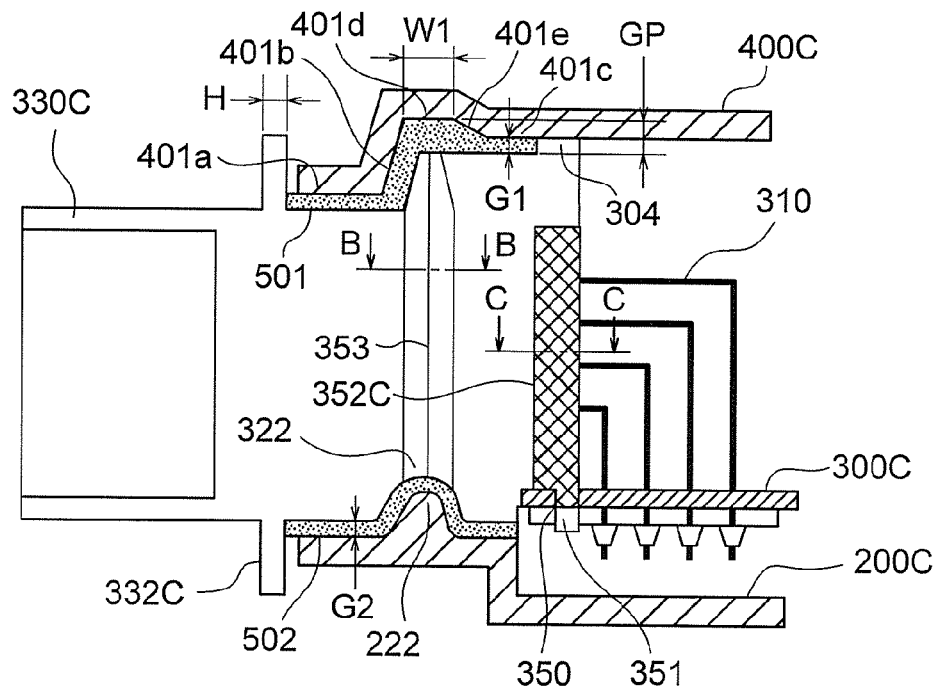
FIG. 21A is a further detailed sectional view illustrating the connector housing of FIG. 18.
Figure 21B:
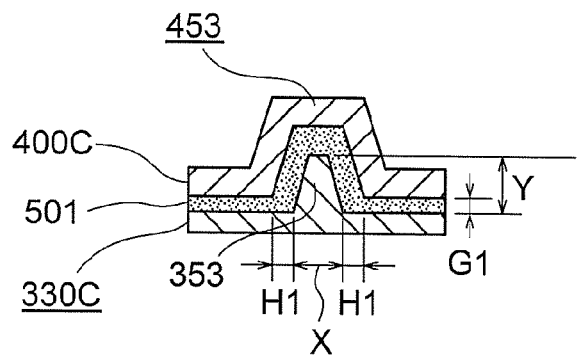
FIG. 21B is a sectional view illustrating the connector housing taken along the line B-B of FIG. 21A.

In FIG. 21A and FIG. 21B, which is a sectional view taken along the line B-B of FIG. 21A, regarding the outer-step flat portions 301a and 401a, the slope portions 301b and 401b, and the inner-step flat portions 301c and 401c (see FIG. 20) defining the first sealing gap, the first horizontal gap H1 in the horizontal direction (right-and-left direction of FIGS. 21A to 21C) between the slope portions satisfies, for example, a relation of $H1 \geq 2 \times G1$ with respect to the first orthogonal gap G1 corresponding to the sealing gap between the outer-step flat portions or between the inner-step flat portions.

Note that, the first sealing gap surface of the cover 400C includes the slope portion 401b serving as an outer inclined surface, the central flat surface 401d, and the inner inclined surface 401e. The outer-step flat portion 401a is formed on an outer side of the outer inclined surface (slope portion) 401b, and an inner side of the inner inclined surface 401e is continuous with the inner-step flat portion 401c.

Further, the enlarged gap dimension GP having a value larger than that of the first orthogonal gap G1 is adopted in a band of the gap widening region W1 of the central flat surface 401d of the cover 400C. Similarly to the first horizontal gap H1, the enlarged gap dimension GP satisfies a relation of GP≥2×G1.

A gap dimension of the second sealing gap, which is defined by the undulating deformation portions 222 and 322 defining the second sealing gap, flat portions extending to inner and outer sides of the undulating deformation portion 222, and flat portions extending to inner and outer sides of the undulating deformation portion 322, is set to the second orthogonal gap G2 in an entire region of the second sealing gap. The second orthogonal gap G2 is designed to have the same value as that of the first orthogonal gap G1.

Figure 21C:
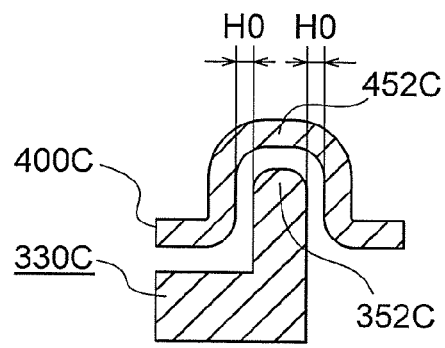
FIG. 21C is a sectional view illustrating the connector housing taken along the line C-C of FIG. 21A.

In FIG. 21C, which is a partially sectional view taken along the line C-C of FIG. 21A, a side-surface convex thread 352C is formed on each oblique side portion of the trapezoid of the connector housing 330C having an exposed end surface of a trapezoid shape, and a side-surface concave thread 452C into which the side-surface convex thread 352C is fitted is formed in the cover 400C.

As described above with reference to FIGS. 4A to 4C and 13A to 13C, the movement margin dimension H0, which is a right or left gap dimension between the side-surface convex thread 352C and the side-surface concave thread 452C, is designed to have the smallest value among those of the first horizontal gap H1 and the second horizontal gap H2.

Therefore, even when there are dimension fluctuations of the respective portions and dimension errors of assembly, the movement margin dimension H0 strictly restricts a relative position between the connector housing 330C and the cover 400C, and thus prevents occurrence of such a situation where dimension fluctuations of the right and left first horizontal gaps H1 become extremely large so that one of the horizontal gaps becomes zero to cause abutment of the inclined surfaces.

Note that, in the above description, the third sealing gap defined between directly-opposing surfaces of the cover 400C and the base 200C is defined between the slope portion 203b and the slope portion 403b illustrated in FIG. 19. Instead of this, there may be adopted the third convex thread 203 and the third concave thread 403, which are described above with reference to FIG. 2. Alternatively, the third sealing gap may be defined between the undulating deformation portion 223 having a convex thread form and the undulating deformation portion 423 having a concave thread form, which are described above with reference to FIG. 11.

(2) Description of Assembling Method

Next, detailed description is made of a method of assembling the waterproof control unit 1000 configured as illustrated in FIGS. 18, 19, 20, and 21A to 21C with reference to the flow chart of assembly described above with reference to FIG. 9 by focusing on differences from the configuration illustrated in FIGS. 1 to 5.

In the third embodiment, steps from the start step 900 for assembly work to the second processing step 903c, and the preparation steps 903a, 903b, and 905a in FIG. 9 are performed similarly to the case of the first embodiment. However, a state of the cover 400C in the first processing step 902 is not shown.

Note that, under a state in Step 902 in which an inner surface of the cover 400C is directed upward, the waterproof sealing material 501 is applied to the gap widening region W1 (see FIG. 21A) formed in the first sealing gap surface of the cover 400C, and the waterproof sealing material 503 is not applied to the third sealing gap surface yet.

In the third processing step 904, the pasty waterproof sealing materials 502 and 503 are applied into a looped shape to the second sealing gap surface of the connector housing 330C and the third sealing gap surface of the cover 400C, respectively.

In Step 904, the waterproof sealing material 502 may be applied to a concave thread portion of the undulating deformation portion 322 (see FIGS. 21A to 21C) of the connector housing 330C, whereas the waterproof sealing material 503 is adhesively applied to the slope portion 403b (see FIG. 19) formed on the three sides of the outer periphery of the cover 400C.

Similarly to the first embodiment, in the fourth processing step 905b subsequent to Step 904, the base 200C having the ventilation filter bonded and fixed thereto in the preparation step 905a is mounted onto the cover 400C under a reversed state, and the heat conductive adhesives 511a and 511b applied in Step 903c and the waterproof sealing materials 502 and 503 applied in Step 904 are joined to the mating surfaces. Then, the cover 400C and the base 200C are integrated and fixed with the coupling screws 414 (see FIG. 18).

Similarly to the first embodiment, Step 906 subsequent to Step 905b is a step of carrying out initial setting, performance inspection, and visual inspection of the waterproof control unit 100C, while drying, at room temperature or under a heated condition, the heat conductive adhesives 511a and 511b and the waterproof sealing materials 501, 502, and 503 applied in Step 903c and Step 904. Thus, the processing proceeds to the general assembly completion step 907.

Note that, as the visual inspection, it is determined whether or not the cover 400C, the connector housing 330C, and the base 200C have a proper relative positional relationship and whether or not degrees of filling of the waterproof sealing materials 501 and 502 are proper by inspecting overflow degrees of the waterproof sealing materials 501 and 502 in the opening gaps H (see FIG. 21A) defined between the looped peripheral wall 3320 of the connector housing 330C and an end surface of the cover 400C and between the looped peripheral wall 332C and an end surface of the base 200C, and by carrying out visual determination or automatic determination using image recognition through comparison with a standard sample.

(3) Description of Other Embodiment

In the above description, various modes of the connector housings are exemplified and described in the first to third embodiments.

As the first sealing gap surface of the connector housing, a first convex thread system (having a triangular cross-section) illustrated in FIG. 3 or a step-slope system (having a step-slope-shaped cross-section) illustrated in FIGS. 12 and 20 is adopted. The cross-section may be formed into a trapezoid shape or an undulating shape.

Note that, the connector housing is processed from a resin, and hence it is easy to form a convex thread having a triangular cross-section. Appropriately-chamfered portion can be formed at an apex portion of the triangular shape, and hence it is not necessary to form the convex thread into a trapezoid shape or an undulating shape on purpose.

As the second sealing gap surface of the connector housing, a second concave thread system (having a trapezoid cross-section) illustrated in FIG. 3, a step-slope system (having a step-slope-shaped cross-section) illustrated in FIG. 12, or an undulating deformation portion system (including a concave thread having an undulating cross-section) illustrated in FIG. 20 is adopted. Various modes of the first sealing gap and the second sealing gap can be freely combined and adopted.

For example, the second sealing gap surface illustrated in FIG. 3 may be changed into the undulating deformation portion system or the step-slope system, and the second sealing gap illustrated in FIG. 12 may be formed into a second concave thread having a trapezoid shape.

Meanwhile, a cross-sectional shape of the third sealing gap between the cover and the base is selected from a trapezoid cross-section system illustrated in FIG. 2, an undulating deformation system illustrated in FIG. 11, and a step-slope system illustrated in FIG. 19. The trapezoid cross-section system is suitable for resin forming or die casting of a metal material (forming performed by heating, melting, and compressing), and the undulating deformation system and the step-slope system are suitable for a case where the cover and the base are made of a sheet metal material.

Various embodiments are assumable for the connector housings according to the present invention, but actually, the connector housing according to any one of the embodiments is selected. The selected connector housing can suit with all of a sheet metal cover, a resin cover, a sheet metal base, and a base formed by die casting.

Note that, the third sealing gap is arranged on a U-shaped plane at the three sides of the outer peripheries of the cover and the base, and respective four sides of the cover and the base are fixed in a press-contact manner with the coupling screws 414 or the folding pieces 413. Thus, the sealing surfaces are mutually formed into even planes, and a uniform sealing gap can be obtained.

Therefore, it is possible to obtain a small-sized sealing structure in which a convexoconcave width of the convexoconcave sealing surface is narrowed as compared to the first sealing gap, and a convexoconcave depth is also reduced as a result.

However, it is difficult for a mountain-shaped curved surface of the connector housing including a top surface and right and left inclined surfaces of the trapezoid, and an opposing surface of the cover at the opening portion of the side surface thereof for covering the mountain-shaped curved surface to define a uniform sealing gap as a whole. Thus, a sealing area and the sealing gap are enlarged, and an amount of application of the waterproof sealing material is increased. In this manner, waterproofness is ensured.

Further, formation of an inclined surface in the sealing surface not only elongates a sealing path (water sealing distance), but also increases deformation strength of the opening portion of the side surface of the cover. The formation is means for obtaining a desired opposing surface that suits with the mountain-shaped curved surface of the connector housing.

(4) Main Points and Features of Third Embodiment

As is apparent from the above description, in the waterproof control unit 100C according to the third embodiment of the present invention, the connector housing 330C through which the plurality of contact terminals 310 pass via the partition wall 333 is positioned and fixed to the circuit board 300C, which is hermetically housed in the casing including the base 200C and the cover 400C and has the circuit components 311 mounted thereon. The waterproof control unit 100C includes the waterproof sealing materials 501, 502, and 503 filled into the first sealing gap defined between opposing surfaces of the connector housing 330C and the cover 400C, the second sealing gap defined between opposing surfaces of the connector housing 330C and the base 200C, and the third sealing gap defined between directly-opposing surfaces of the base 200C and the cover 400C, so as to expose, from the opening portion of the side surface of the cover 400C, an external-connection end surface of the connector housing.

The connector housing 330C is made of a resin forming material, and a first opposing surface, which includes a flat surface and an inclined surface forming one of the opposing surfaces of the first sealing gap, is formed on three sides of the outer periphery of the connector housing 330C.

A second opposing surface, which includes a flat surface and an inclined surface forming one of the opposing surfaces of the second sealing gap, is formed on one remaining side of the outer periphery of the connector housing 330C serving as a bottom surface thereof.

The inclined surface of the first opposing surface includes the slope portion 301b connecting the outer-step flat portion 301a and the inner-step flat portion 301c in a stepped manner.

The inclined surface of the second opposing surface includes the undulating deformation portion 322 having a recessed cross-section.

The first opposing surface and the second opposing surface extend across the inner boundary surface 335 of the partition wall 333 toward an inside and an outside of the casing.

The connector housing 330C further includes the looped peripheral wall 332C formed at a position of the outer periphery of the connector housing 330C exposed from the casing, and the pair of side-surface convex threads 352C formed on both side surfaces at a position of an unexposed end surface of the connector housing 330C.

The looped peripheral wall 332O is opposed to an opening side surface of the cover 400O and an end surface of the base 200C with the opening gap H.

The side-surface convex threads 352C function as the plane movement regulating members that are fitted into the pair of side-surface concave threads 452C formed in the cover 400O, and a relative position between the connector housing 330C and the cover 400C is regulated by the plane movement regulating members so that a plane movement gap dimension of the first sealing gap is kept within a predetermined range of fluctuation.

Therefore, the waterproof control unit 100C according to the third embodiment includes the cover 400C made of inexpensive sheet metal that is produced in a shorter processing time period than a forming material, and the base 200C formed by die casting, which has an excellent heat radiating property. Thus, the configuration according to the third embodiment is suitable for the waterproof control unit 100C requiring increase in mounting area and improvement in heat conductivity.

The connector housing 330C includes the partition wall 333, into which the plurality of contact terminals 310 of a right-angle type are press-fitted. The end surface of the connector housing has a trapezoid shape. A long base of the trapezoid is positioned by the positioning protrusion piece 351 and the board engagement portion 350, and is fixed to one side of the circuit board 300C, and a portion of the connector housing projecting beyond the one side of the circuit board 300C is opposed to the base 200C via the second sealing gap. A short top side and right and left oblique sides of the trapezoid are opposed to the opening portion of the side surface of the cover 400C via the first sealing gap.

At least a part of one of the inner-step flat portion 301c continuous with the slope portion 301b defining the first sealing gap extends beyond the inner boundary surface 335 of the partition wall 333 toward the inside of the casing.

At least a part of the flat portion continuous with the undulating deformation portion 322 defining the second sealing gap extends beyond the inner boundary surface 335 of the partition wall 333 toward the inside of the casing.

As described above, in relation to claim 2 of the present invention, the plurality of contact terminals of a right-angle type are press-fitted and fixed into the partition wall of the connector housing. The end surface of the connector housing has a trapezoid shape. The first sealing gap between the connector housing and the cover and the second sealing gap between the connector housing and the base extend toward the inside of the casing beyond the inner boundary surface of the partition wall.

Therefore, similarly to the first embodiment, the present invention has the following features. The first and second sealing gaps are elongated using an idle space formed around the extending inner horizontal portions of the contact terminals, and thus it is possible to ensure a sealing surface distance even when the slant portions defining the sealing gap have gentle inclinations. Thus, sealing surfaces can be formed with simple die structure.

Further, the present invention has the following features. The connector housing has a trapezoid shape, and hence an idle space is formed at the oblique side portion on a long base side. Thus, it is easy to arrange the side-surface convex thread and the side-surface concave thread serving as the plane movement regulating members, and it is easy to apply the waterproof sealing material in the first sealing gap formed in the opening portion of the side surface of the cover.

The first sealing gap is defined between opposing surfaces of the slope portion 301b formed on the three sides of the outer periphery of the connector housing 330C and the slope portion 401b formed in the cover 400C, and each of the slope portions 301b and 401b is elongated to the outer-step flat portion 301a or 401a and the inner-step flat portion 301c or 401c.

The second sealing gap is defined between opposing surfaces of the undulating deformation portion 322, which has a recessed cross-section and is formed on the one remaining side of the outer periphery of the connector housing 330C serving as the bottom surface thereof, and the undulating deformation portion 222, which has a protruded cross-section and is formed in the base 200C.

A slant portion forming each of the undulating deformation portions 322 and 222 has an angle of inclination equal to or gentler than a slope of the slope portion 301b or 401b.

As described above, in relation to claim 7 of the present invention, the first sealing gap and the second sealing gap are each defined between step-slope surfaces or undulating-slope surfaces having gentle inclined surfaces, and thus can be processed with a simple die.

Therefore, the present invention has a feature in that the cover and the base can be formed of products formed by sheet metal working. Whether a product formed by resin forming or aluminum die casting is used for the cover or the base is determined depending on a method of forming the third sealing gap, and hence the present invention has a feature in that the same die for manufacturing the connector housing can be used irrespective of the configuration of the third sealing gap.

Irrespective of differences in structure from the first sealing gap and the second sealing gap, the third sealing gap is selected as appropriate from any one of opposing surfaces of the third convex thread 203, the undulating deformation portion 223, or the slope portion 203b, which is formed on the three sides of the periphery of the base 200C, and the third concave thread 403, the undulating deformation portion 423, or the slope portion 403b, which is formed on the three sides of the periphery of the cover 400C.

Among the opposing surfaces, the slope portions 203b and 403b include opposing inclined surfaces having an angle of inclination equal to or gentler than an angle of inclination of the undulating deformation portions 223 and 423, and define the third sealing gap having a wide dimension suitable for sheet metal working.

As described above, in relation to claim 8 of the present invention, depending on a size of an allowable sealing width dimension, the third sealing gap can be selected as appropriate from the sealing surfaces of the step-slope system, the sealing surfaces of the undulating deformation portion system, and the sealing surfaces of the convexoconcave sealing surface system.

Therefore, the present invention has the following features. When the step-slope system is selected, both the cover and the base can be formed of inexpensive products formed by sheet metal working. In a case where a heat dissipating property is required, a base formed by die casting can be used. In addition, the same die for manufacturing the connector housing can be used irrespective of the configuration of the third sealing gap.

The present invention provides a method of assembling the waterproof control unit according to the third embodiment, in which the central flat surface 401d sandwiched between the outer inclined surface 401b and the inner inclined surface 401e is formed on the inner surface of the cover 400C forming one of gap surfaces of the first sealing gap, and the enlarged gap dimension GP between the central flat surface 401d and the connector housing 330C is set to be larger than the first orthogonal gap G1 at a flat surface situated on an outer side of the outer inclined surface 401b, and than the first orthogonal gap G1 at a flat surface situated on an inner side of the inner inclined surface 401e, the method including:

the first processing step 902 of mounting the cover 400C onto a jig under a reversed state, and applying, into a non-looped shape, the pasty waterproof sealing material 501 to the central flat surface 401d of the cover 400C;

the second processing step 903c of mounting, onto stepped portions provided on three sides of the outer periphery of the cover 400C, the circuit board 300C having the circuit components 311 and the connector housing 330C mounted and soldered thereonto in advance, to thereby join the connector housing 330C and the cover 400C;

the third processing step 904 of applying, into a looped shape, the pasty waterproof sealing material 503 to a sealing surface defining the third sealing gap of the cover 400C that has been subjected to the second processing step, and the pasty waterproof sealing material 502 to a sealing surface defining the second sealing gap of the connector housing 330C; and the fourth processing step 905b of mounting the base 200C onto the cover 400C that has been subjected to the third processing step 904, integrating and fixing the cover 400C and the base 200C, and sandwiching and fixing the circuit board 300C by three sides of an outer periphery of the base 200C and the three sides of the outer periphery of the cover 400C, the method further including drying and curing, after finishing the fourth processing step 905b, the pasty waterproof sealing materials 501, 502, and 503 by standing at room temperature or heating while carrying out visual inspection and performance inspection.

What is claimed is:

1. A waterproof control unit, comprising:
a base and a cover;
a circuit board that is hermetically housed in a casing comprising the base and the cover, and has circuit components mounted thereon;
a connector housing that is positioned and fixed to the circuit board, and allows a plurality of contact terminals to pass therethrough via a partition wall; and
a waterproof sealing material filled into each of a first sealing gap defined between opposing surfaces of the connector housing and the cover, a second sealing gap defined between opposing surfaces of the connector housing and the base, and a third sealing gap defined between directly-opposing surfaces of the base and the cover, so as to expose, from an opening portion of a side surface of the cover, an external-connection end surface of the connector housing,
wherein the connector housing is made of a resin forming material, and a first opposing surface, which comprises a flat surface and an inclined surface forming one of the opposing surfaces of the first sealing gap, is formed on three sides of an outer periphery of the connector housing,
wherein a second opposing surface, which comprises a flat surface and an inclined surface forming one of the opposing surfaces of the second sealing gap, is formed on one remaining side of the outer periphery of the connector housing serving as a bottom surface thereof,
wherein the inclined surface of the first opposing surface comprises a slope portion connecting an outer-step flat portion and an inner-step flat portion in a stepped manner, or a first convex thread having a triangular cross-section,
wherein the inclined surface of the second opposing surface comprises any one of a slope portion connecting an outer-step flat portion and an inner-step flat portion in a stepped manner, a second concave thread having a trapezoid cross-section, or an undulating deformation portion having a recessed cross-section,
wherein the first opposing surface and the second opposing surface extend across an inner boundary surface of the partition wall toward an inside and an outside of the casing,
wherein the connector housing further comprises a looped peripheral wall formed at a position of the outer periphery of the connector housing exposed from the casing, and a pair of side-surface convex threads formed on both side surfaces at a position of an unexposed end surface of the connector housing,
wherein the looped peripheral wall is opposed to an opening side surface of the cover and an end surface of the base with an opening gap (H),
wherein the side-surface convex threads function as plane movement regulating members that are fitted into a pair of side-surface concave threads formed in the cover, and
wherein a relative position between the connector housing and the cover is regulated by the plane movement regulating members so that a plane movement gap dimension of the first sealing gap is kept within a predetermined range of fluctuation.

2. A waterproof control unit according to claim 1,
wherein the connector housing comprises the partition wall, into which the plurality of contact terminals of a right-angle type are press-fitted,
wherein the end surface of the connector housing has a trapezoid shape,
wherein a long base of the trapezoid is positioned by a positioning protrusion piece and a board engagement portion, and is fixed to one side of the circuit board, and a portion of the connector housing projecting beyond the one side of the circuit board is opposed to the base via the second sealing gap,
wherein a short top side and right and left oblique sides of the trapezoid are opposed to the opening portion of the side surface of the cover via the first sealing gap,
wherein at least a part of a flat portion continuous with an inner inclined surface of the first convex thread or the inner-step flat portion continuous with the slope portion, which defines the first sealing gap, extends beyond the inner boundary surface of the partition wall toward the inside of the casing, and
wherein at least a part of a flat portion continuous with an inner inclined surface of the second concave thread, the inner-step flat portion continuous with the slope portion, or a flat portion continuous with the undulating deformation portion, which defines the second sealing gap, extends beyond the inner boundary surface of the partition wall toward the inside of the casing.

3. A waterproof control unit according to claim 1,
wherein a plurality of gap-setting protrusions are interspersed on one of the connector housing and the cover defining the first sealing gap, and abut on another one of the connector housing and the cover, and
wherein the gap-setting protrusions are provided at a terminal end position of an inner surface of the casing to which the waterproof sealing material is applied, and function as members for regulating a gap in a direction orthogonal to the first sealing gap.

4. A waterproof control unit according to claim 1,
wherein a protrusion piece having a positioning fitting hole formed therein is provided on the end surface of the base,
wherein a cutout portion is formed in the looped peripheral wall, and the protrusion piece is fitted into and closely opposed to the cutout portion, and
wherein a positioning protrusion is provided in a projecting manner on the cutout portion, and the positioning protrusion is fitted into the positioning fitting hole.

5. A waterproof control unit according to claim 1,
wherein the first sealing gap is defined between opposing surfaces of the first convex thread, which has a triangular cross-section and is formed on the three sides of the outer periphery of the connector housing, and a first concave thread, which has a trapezoid cross-section and is formed in the cover, wherein the second sealing gap is defined between opposing surfaces of the second concave thread, which has a trapezoid cross-section and is formed on the one remaining side of the outer periphery of the connector housing serving as the bottom surface thereof, and a second convex thread, which has a trapezoid cross-section and is formed on the base, wherein a bottom of the first convex thread extends beyond the inner boundary surface of the partition wall so as to have a wide dimension so that both inclined surfaces of the convex thread each have a gentle inclination, and wherein slant portions forming the second convex thread each have an angle of inclination equal to or gentler than an angle of inclination of the first convex thread.

6. A waterproof control unit according to claim 5, wherein irrespective of differences in structure from the first sealing gap and the second sealing gap, the third sealing gap is opposing surfaces of a third convex thread, which is formed on three sides of a periphery of the base, and a third concave thread, which is formed on three sides of a periphery of the cover, and wherein among the opposing surfaces, the third convex thread and the third concave thread have a larger fitting depth than a fitting width dimension, and define the third sealing gap having a narrow width dimension suitable for resin forming or die casting.

7. A waterproof control unit according to claim 1, wherein the first sealing gap is defined between opposing surfaces of the slope portion formed on the three sides of the outer periphery of the connector housing and a slope portion formed in the cover, and each of the slope portions is elongated to the inner-step flat portion and the outer-step flat portion, and wherein the second sealing gap is defined between opposing surfaces of the slope portion formed on the one remaining side of the outer periphery of the connector housing serving as the bottom surface thereof and a slope portion formed in the base, and each of the slope portions is elongated to the inner-step flat portion and the outer-step flat portion.

8. A waterproof control unit according to claim 7, wherein irrespective of differences in structure from the first sealing gap and the second sealing gap, the third sealing gap is opposing surfaces of an undulating deformation portion, which is formed on three sides of a periphery of the base, and an undulating deformation portion, which is formed on three sides of a periphery of the cover, and wherein the undulating deformation portions have a smaller fitting depth than a mutual fitting width dimension, and define the third sealing gap having a large width dimension suitable for sheet metal working.

9. A waterproof control unit according to claim 1, wherein the first sealing gap is defined between opposing surfaces of the slope portion formed on the three sides of the outer periphery of the connector housing and a slope portion formed in the cover, and each of the slope portions is elongated to the outer-step flat portion and the inner-step flat portion, wherein the second sealing gap is defined between opposing surfaces of the undulating deformation portion, which has a concave-thread-shaped and undulating cross-section and is formed on the one remaining side of the outer periphery of the connector housing serving as the bottom surface thereof, or an undulating deformation portion, which has a convex-thread-shaped and undulating cross-section and is formed in the base, and wherein a slant portion forming the undulating deformation portion has an angle of inclination equal to or gentler than a slope of the slope portion.

10. A waterproof control unit according to claim 9, wherein irrespective of differences in structure from the first sealing gap and the second sealing gap, the third sealing gap is opposing surfaces of a slope portion, which is formed on three sides of a periphery of the base, and a slope portion, which is formed on three sides of a periphery of the cover, and wherein the slope portions comprise gentle opposing inclined surfaces, and define the third sealing gap having a wide dimension suitable for sheet metal working.

11. A method of assembling the waterproof control unit of claim 1, in which a central flat surface sandwiched between an outer inclined surface and an inner inclined surface is formed on an inner surface of the cover forming one of gap surfaces of the first sealing gap, and an enlarged gap dimension (GP) between the central flat surface and the connector housing is set to be larger than a first orthogonal gap (G1) at a flat surface situated on an outer side of the outer inclined surface, and than a first orthogonal gap (G1) at a flat surface situated on an inner side of the inner inclined surface, the method comprising:

a first processing step of mounting the cover onto a jig under a reversed state, and applying, into a non-looped shape, a pasty waterproof sealing material to the central flat surface of the cover;

a second processing step of mounting, onto stepped portions provided on three sides of an outer periphery of the cover, the circuit board having the circuit components and the connector housing mounted and soldered thereonto in advance, to thereby join the connector housing and the cover;

a third processing step of applying, into a looped shape, a pasty waterproof sealing material to a sealing surface defining the third sealing gap of the cover that has been subjected to the second processing step, and a pasty waterproof sealing material to a sealing surface defining the second sealing gap of the connector housing; and a fourth processing step of mounting the base onto the cover that has been subjected to the third processing step, integrating and fixing the cover and the base, and sandwiching and fixing the circuit board by three sides of an outer periphery of the base and the three sides of the outer periphery of the cover, the method further comprising drying and curing, after finishing the fourth processing step, the pasty waterproof sealing materials by standing at room temperature or heating while carrying out visual inspection and performance inspection.

12. A method of assembling the waterproof control unit according to claim 11, wherein the second processing step comprises an additional processing step of applying, for the waterproof control unit comprising, as the circuit components, a first heat generating component mounted on a surface of the circuit board, which is opposed to the cover, or a second heat generating component mounted on a surface of the circuit board, which is opposed to the base, and comprising, on the base, a first heat transfer base portion adjacent to a back surface of the first heat generating component or a second heat transfer base portion adjacent to the second heat generating component, a pasty heat conductive adhesive to a surface of the circuit board, which corresponds to the first or second heat transfer base portion, and wherein, in the additional processing step, applying work is performed under a state in which the circuit board is covered with a transparent jig plate having a window hole through which the heat conductive adhesive is applied.

* * * * *